(12) United States Patent
Blom et al.

(10) Patent No.: US 9,161,427 B2
(45) Date of Patent: Oct. 13, 2015

(54) DEVICE AND METHOD FOR GENERATING A PLASMA DISCHARGE FOR PATTERNING THE SURFACE OF A SUBSTRATE

(75) Inventors: Paulus Petrus Maria Blom, Veldhoven (NL); Alquin Alphons Elisabeth Stevens, Eindhoven (NL); Laurentia Johanna Huijbregts, Eindhoven (NL); Hugo Anton Marie De Haan, Son (NL); Antonius Hubertus Van Schijndel, Deurne (NL); Edwin Te Sligte, Eindhoven (NL); Nicolaas Cornelis Josephus Van Hijningen, Eindhoven (NL); Tom Huiskamp, Eindhoven (NL)

(73) Assignee: Vision Dynamics Holding B.V., Eindhoven (NL)

( * ) Notice: Subject to any disclaimer, the term of this patent is extended or adjusted under 35 U.S.C. 154(b) by 45 days.

(21) Appl. No.: 13/579,051

(22) PCT Filed: Feb. 17, 2010

(86) PCT No.: PCT/NL2010/050079
§ 371 (c)(1),
(2), (4) Date: Oct. 10, 2012

(87) PCT Pub. No.: WO2011/102711
PCT Pub. Date: Aug. 25, 2011

(65) Prior Publication Data
US 2013/0206720 A1 Aug. 15, 2013

(51) Int. Cl.
*C23F 1/00* (2006.01)
*H05H 1/46* (2006.01)
(Continued)

(52) U.S. Cl.
CPC ................ *H05H 1/46* (2013.01); *C23C 16/042* (2013.01); *C23C 16/503* (2013.01); *C23C 16/509* (2013.01); *H05H 1/24* (2013.01); *H05H 1/44* (2013.01)

(58) Field of Classification Search
CPC ..... H05H 1/46; H05H 1/44; H05H 2001/466; H05H 2001/481; H05H 2001/483; H05H 200/4645
USPC ............. 156/345.44, 345.43, 345.47, 345.48, 156/345.49, 345.51; 216/13, 14, 24, 67, 68, 216/71
See application file for complete search history.

(56) References Cited

U.S. PATENT DOCUMENTS

| | | |
|---|---|---|
| 4,349,409 A | 9/1982 | Shibayama et al. |
| 4,764,249 A | 8/1988 | Gobrecht et al. |

(Continued)

FOREIGN PATENT DOCUMENTS

| | | |
|---|---|---|
| JP | S56158428 A | 12/1981 |
| JP | S58110674 A | 7/1983 |

(Continued)

OTHER PUBLICATIONS

International Search Report, PCT/NL2010/050079, mailing date: Nov. 17, 2010.

*Primary Examiner* — Lan Vinh
(74) *Attorney, Agent, or Firm* — Banner & Witcoff, Ltd.

(57) ABSTRACT

Device for generating a plasma discharge near a substrate for patterning the surface of the substrate, comprising a first electrode having a first discharge portion and a second electrode having a second discharge portion, a high voltage source for generating a high voltage difference between the first and the second electrode, and positioning means for positioning the first electrode with respect to the substrate. The device is further provided with an intermediate structure that is, in use, arranged in between the first electrode and the substrate while allowing for positioning the first electrode with respect to the substrate.

36 Claims, 17 Drawing Sheets

(51) Int. Cl.
*H05H 1/44* (2006.01)
*C23C 16/04* (2006.01)
*C23C 16/503* (2006.01)
*C23C 16/509* (2006.01)
*H05H 1/24* (2006.01)

(56) References Cited

U.S. PATENT DOCUMENTS

| | | | |
|---|---|---|---|
| 4,911,075 A | | 3/1990 | Lewis et al. |
| 5,084,125 A | * | 1/1992 | Aoi .................. 156/345.31 |
| 5,361,693 A | * | 11/1994 | Farb et al. .................. 101/93.04 |
| 6,629,757 B1 | * | 10/2003 | Sugioka et al. .................. 347/71 |
| 6,779,935 B1 | | 8/2004 | Gemmell |
| 7,768,617 B2 | * | 8/2010 | Yamazaki et al. ............ 349/147 |
| 2002/0100556 A1 | | 8/2002 | Kim et al. |
| 2003/0052096 A1 | * | 3/2003 | Crowe et al. ............. 219/121.43 |
| 2004/0129220 A1 | | 7/2004 | Saitoh et al. |
| 2006/0163500 A1 | * | 7/2006 | Inoue et al. ................. 250/493.1 |
| 2007/0000867 A1 | * | 1/2007 | Saeki .............................. 216/67 |
| 2009/0126634 A1 | | 5/2009 | Yamazawa |

FOREIGN PATENT DOCUMENTS

| | | |
|---|---|---|
| JP | S61204740 U | 12/1986 |
| JP | 2003229299 A | 8/2003 |
| JP | 2004-111948 A | 4/2004 |
| JP | 2004220935 A | 8/2004 |
| JP | 2009043673 A | 2/2009 |
| WO | 2004/090931 A2 | 10/2004 |
| WO | 2009/096785 A1 | 8/2009 |

* cited by examiner

DEVICE AND METHOD FOR GENERATING A PLASMA DISCHARGE FOR PATTERNING THE SURFACE OF A SUBSTRATE

CROSS-REFERENCE TO RELATED APPLICATIONS

This application is a U.S. National Stage application under 35 U.S.C. §371 of International Application PCT/NL2010/050079 (published as WO 2011/102711 A1), filed Feb. 17, 2010. Benefit of the filing date of this application is hereby claimed. This application is hereby incorporated by reference in its entirety.

The invention relates to a device for generating a plasma discharge for patterning the surface of a substrate, especially to such device comprising a first electrode having a first discharge portion and a second electrode having a second discharge portion, a high voltage source for generating a high voltage difference between the first and the second electrode, and positioning means for positioning the first electrode with respect to the substrate.

BACKGROUND OF THE INVENTION

It is well-known that plasma's can be used to treat a surface; with the use of a plasma, it is possible to etch, to deposit a material onto a substrate, and/or to change a property of a surface of a substrate, e.g. changing it from hydrophobic to hydrophilic and chemical attachment of atoms. The latter can for example be used in the process of metalizing a plastic substrate (see for example M. Charbonnier et al. in Journal of Applied Electrochemistry 31, 57 (2001)). In this process, a plasma makes the surface of a plastic suitable for attachment of Palladium, on which a metal layer can be grown. Compared to many other metalizing methods, this method has the advantage that the temperature can remain low, which is necessary for plastics having low melting points. For the production of plastic electronics like RFID tags and OLEDs, plasma treatment may thus be useful.

For these applications, making patterned structures directly with the plasma on the surface reduces the number of steps for the fabrication of the electronics. Further, compared to traditional mask/etch methods, there is no waste of metal (due to deposition and subsequent etching of the metal layer), reducing environmental burden. Also for other applications, like labs on chips, direct patterning with a plasma would be useful.

Known devices for directly patterning a surface with a plasma are described in DE 10322696 and in Surface & Coatings Technology 200, 676 (2005). These devices use a mask provided with a desired pattern for generating that pattern. This may be a good method for mass production, but, as making a mask is quite expensive, takes time and must be performed each time a new pattern is required, a maskless method would be preferable for production of smaller amounts.

Another device for directly patterning a surface with a plasma is known from U.S. Pat. No. 4,911,075. This device utilizes a precisely positioned high voltage spark discharge electrode to create on the surface of a substrate an intense-heat spark zone as well as a corona zone in a circular region surrounding the spark zone. The discharge electrode is scanned across the surface while high voltage pulses having precisely controlled voltage and current profiles to produce precisely positioned and defined spark/corona discharges in register with a digital image. Although not using a physical mask, this device has the disadvantage that complicated precise control of the high voltage pulses is required. Further, since the device uses a counter electrode behind the substrate, only thin substrates may be used. Also, spark discharge may not be desirable for certain processes of deposition, etching and hydrophilation.

In PCT/NL2008/050555 a method and apparatus are described that relate to plasma patterning. PCT/NL2008/050555 describes a method and apparatus wherein the positioning means are arranged for positioning the first electrode selectively with respect to the second electrode. The first electrode can be positioned in a first position in which a distance between the first discharge portion and the second discharge portion is sufficiently small to support the plasma discharge at the high voltage difference, and in a second position in which the distance between the first discharge portion and the second discharge portion is sufficiently large to prevent plasma discharge at the high voltage difference.

SUMMARY OF THE INVENTION

It is an object of the invention to provide a device for generating a plasma discharge, suitable for maskless direct patterning of a substrate, which is improved with respect to devices that were previously disclosed. The device should preferably have simple control, long electrode life, be able to quickly pattern the substrate and/or be suitable for a large range of substrates, e.g. thick and thin substrates.

More in general, it is an object of the invention to provide a device for generating a plasma discharge near a substrate for patterning the surface of the substrate, comprising a first electrode having a first discharge portion and a second electrode having a second discharge portion, a high voltage source for generating a high voltage difference between the first and the second electrode and, preferably, positioning means for positioning the first electrode with respect to the substrate, the device being improved with respect to devices that were previously disclosed.

According to the invention there is provided a device for generating a plasma discharge near a substrate for patterning a surface of the substrate, comprising: a first electrode having a first discharge portion and a second electrode having a second discharge portion, a high voltage source for generating a high voltage difference between the first and the second electrode, and positioning means for positioning the first electrode with respect to the substrate, wherein the device is further provided with an intermediate structure that is, in use, arranged in between the first electrode and the substrate. Preferably, the intermediate structure allows for positioning the first electrode with respect to the substrate. By means of the intermediate structure, the generated plasma can be utilized more beneficially and/or can be used to enable an additional functionality. Preferably, the intermediate structure is a sheet such as a plate.

Positioning the first electrode with respect to the substrate may comprise moving the first electrode towards and/or along the substrate. Positioning the first electrode may be allowed by having an open space between the intermediate structure and the substrate and/or between the intermediate structure and the first electrode. Optionally, the intermediate structure is mechanically coupled to the first electrode so that it moves along the substrate together with the first electrode.

In an embodiment, the positioning means comprise a piezo-electric actuator that is mechanically coupled to the first electrode for positioning the first electrode with respect to the substrate. By means of the piezo-electric actuator, a relatively high precision in positioning the first electrode can be reached. In this embodiment, the device is not necessarily provided with the intermediate structure. It will be appreciated that it is also possible that the first electrode is formed by a piezo-electric actuator, optionally provided with an additional electrically conducting coating on at least a portion of the outer surface thereof at or near the discharge portion.

In an embodiment, the intermediate structure is formed as a sheet provided with at least one aperture, preferably a plurality of apertures, for providing therethrough the plasma. Optionally, such apertures may have a maximum dimension, such as a maximum diameter, that is smaller than a minimum distance between the first electrode and the substrate. As the plasma may reach the substrate through the apertures, the apertures can influence a size of an area of the substrate that is treated by the plasma. By tuning dimensions of the apertures, the intermediate structure can be utilized to reduce a spot size or track width of a pattern generated by the plasma. In this way, a resolution of the pattern can be improved. The maximum dimension of at least one, optionally all, of the apertures may e.g. be 10 micrometer or 20 micrometer. Hence, the at least one, optionally all, of the apertures may e.g. have a diameter of at most 10 micrometer or at most 20 micrometer. The apertures may e.g. be beneficially employed by providing a gas therethrough for forming the plasma. In this way the gas flow can be focussed. The gas can be used more economically. This embodiment may have the additional advantage that the first electrodes can be cooled by the gas flow through the apertures.

In an embodiment, the intermediate structure comprises, and preferably essentially consists of, an electrically non-conductive material. In this way the electric field generated by the high voltage source can be concentrated through the apertures. In this way the size of the area of the substrate that is treated by the plasma can be effectively reduced. That is, the aperture may be used as a diaphragm for effectively reducing the size of the plasma at the substrate. The intermediate structure may be positioned in between the first and the second electrodes.

In an embodiment, the intermediate structure may comprise, and preferably essentially consists of, an electrically conductive material that may form the second electrode. In this way it is possible that the substrate need not be positioned in between the first and second electrode. Exposing the substrate to the electric field generated by the high voltage source may thus be substantially prevented. This may be important if the substrate is relative thick. Then, placing the substrate in between the first and second electrode would require a relatively high electric field for creating a plasma. This may also be important if the substrate is provided with relatively vulnerable components like integrated circuits, which can be damaged by strong electric fields. It will be appreciated that the intermediate structure may be segmented. The intermediate structure may comprise separate segments, each corresponding to an associated first electrode. This allows for the segments to be switched relative to the high voltage source, so as to switch the plasma on and off.

Preferably, the first electrode and/or the second electrode, e.g. the electrically conductive material, may be provided with an electrically insulating cover. In this way, spark formation between the first and second electrode may be hindered and may even be prevented.

In an embodiment, the intermediate structure is formed as a sheet, such as a ribbon, that comprises a process material, such as a precursor or depositable material, that is at least partly displaceable by means of the plasma. By means of the intermediate structure, the generated plasma can be utilized to enable processing, e.g. deposition, of the at least part of the process material, e.g. the depositable material. In this way an additional functionality of the device can be provided.

In an embodiment, the intermediate structure comprises a carrier sheet provided with the process material, wherein the process material is at least partly removable from the carrier sheet by means of the plasma. By means of the intermediate structure, the generated plasma can be utilized to enable processing, e.g. deposition, of the process material held by the carrier sheet. Preferably, in use the process material is arranged in between the carrier sheet and the substrate. However, this is not necessary. Optionally, the carrier-sheet may, e.g. at least partly, be mesh-shaped. Then, the process material may be provided within openings of the mesh. The process material may e.g. be impregnated in the mesh-shaped carrier.

In an embodiment, the positioning means are arranged for selectively positioning the first electrode with respect to the second electrode in a first position in which a distance between the first discharge portion and the second discharge portion is sufficiently small to support the plasma discharge at the high voltage difference, and in a second position in which the distance between the first discharge portion and the second discharge portion is sufficiently large to prevent plasma discharge at the high voltage difference. Preferably, the positioning means are arranged for moving the first electrode in a direction towards and away from the second electrode.

This provides the advantage that the plasma can be switched on or off by placing the first electrode in the first or second position respectively using the positioning means. Hence, no control of the high voltage supply to the electrodes is necessary.

In an embodiment, the second electrode is designed as a drum on the outer surface of which a sheet-shaped substrate can be placed in between the drum and the first electrode, while the positioning means are arranged for moving the first electrode in a direction normal to the outer surface. Hence, sheet-shaped electrically insulating substrates, such as plastic foil, may be patterned.

In another embodiment, the positioning means are further arranged for positioning the second electrode in synchronism with the first electrode. This provides the advantage that the first and second electrode together, e.g. as a writing head, can be scanned along the surface of the substrate, hence scanning the plasma along the surface. Moreover, the first and second electrode being scanned in synchronism, e.g. side-by-side, provides the advantage that no electrode is required behind the substrate, so that also non-sheet-shaped substrates, such as thick substrates, irregularly shaped substrates and/or three-dimensional substrates can be scanned.

Preferably, the positioning means are further arranged for positioning the first electrode along the surface of the substrate. Thus, in addition to switching the plasma on or off, the positioning means can also be used to scan the first electrode, and hence the plasma, along the surface of the substrate. It will be appreciated that the positioning means may comprise separate actuators, e.g. a first actuator for moving the first electrode in a direction towards and away from the second electrode, a second actuator to move the first electrode in a first direction along the surface of the substrate and a third actuator to move the first electrode in a second direction along the surface of the substrate.

Preferably, the device further comprising a housing, wherein the first electrode is at least partially surrounded by the housing, and the first electrode is movable with respect to the housing. The housing may be electrically insulating. Thus, the first electrode may be protected by the housing. It is for instance possible that the first electrode is substantially fully retracted within the housing when in the second position and partly protrudes from the housing when in the first position. Thus, the first electrode may be protected from dirt, debris or reaction products of the plasma.

Preferably the high voltage source is arranged for adjusting the high voltage difference between the first and the second electrode. Hence, it is possible to adjust e.g. the spatial extent of the plasma when ignited. Thus, a "dot size" may be adjusted of an area of the substrate affected by the plasma when on. Thus, the dot size of "printing" the pattern on the substrate using the plasma may be determined.

In an embodiment, the device comprises a plurality of first electrodes. These first electrodes may e.g. be placed side-by-side in a print head, so as to be positioned along the surface of the substrate simultaneously.

Preferably, the positioning means are arranged for individually positioning each first electrode with respect to the second electrode. Thus, each first electrode of the plurality of first electrodes may be individually positioned to ignite or extinguish the plasma.

It is also possible that the device comprises a plurality of second electrodes. Preferably, the positioning means are arranged for individually positioning each first electrode with respect to one or more second electrodes.

In a special embodiment, the first electrode is formed by a movable pen of a print head of a matrix printer, electrically conducting connected to the high voltage source.

In an embodiment, the positioning means are further arranged for positioning the second electrode in synchronism with the first electrode, wherein the positioning means are not necessarily arranged for positioning the first electrode with respect to the second electrode. This also provides the advantage that the first and second electrode together, e.g. as a writing head, can be scanned along the surface of the substrate, hence scanning the plasma along the surface. Moreover, the first and second electrode being scanned in synchronism, e.g. side-by-side, provides the advantage that no electrode is required behind the substrate, so that also thick substrates, irregularly shaped substrates and/or three-dimensional substrates can be scanned.

In an embodiment, the device is be provided with a height measuring apparatus for determining the height of the plasma source over the substrate, a height actuator to adjust the height of the plasma source above the substrate and a height controller for controlling, preferably real-time, the height of the plasma source over the substrate to correct for any irregularities in the shape of the substrate.

According to an aspect of the invention, the device for generating a plasma discharge for patterning the surface of a substrate comprises a plurality of first electrodes and a plurality of second electrodes, a high voltage source arranged for generating a high voltage difference between selected first electrodes of the plurality of first electrodes and selected second electrodes of the plurality of second electrodes. Herein the device does not necessarily comprise positioning means for positioning the first and/or second electrodes. Thus, the plurality of first electrodes and the plurality of second electrodes may treat a selected portion of the surface of the substrate by providing the high voltage difference between the associated first and second electrodes. The device may treat the entire selected portion at once, or by applying the high voltage difference to selected first and second electrodes consecutively. Preferably, the first and second electrodes are positioned side-by-side. Preferably the first and second electrodes are interspersed. Optionally, the first and second electrodes are, at least near the substrate, entirely comprised in an electrically insulating, e.g. ceramic, house.

In an embodiment, the first electrode is provided with a gas-supply arranged for supplying therethrough a gas for forming the plasma. Preferably, the first electrode is formed by a hollow pen. This embodiment can be advantageously combined with the embodiment wherein the intermediate structure comprises the electrically conductive material that forms the second electrode. In the latter embodiment, the electric field may not, or only to a limited extent, force the plasma to reach the substrate. As a result, a gas stream to move the plasma towards the substrate will be appreciated. Such a gas stream can be provided e.g. through the hollow pen. It may be clear that the gas supply does not necessarily need to be provided to the first electrode, but that other parts of the device may be provided with the gas-supply instead or in addition to the first electrode.

The invention also relates to a method for patterning the surface of a substrate using a plasma discharge, comprising: providing a first electrode having a first discharge portion and a second electrode having a second discharge portion, creating the plasma discharge by generating a high voltage difference between the first discharge portion and the second discharge portion, i.e. between the first and the second electrode, thus generating the plasma near the substrate, positioning the first electrode with respect to the substrate, and arranging an intermediate structure in between the first electrode and the substrate.

Preferably, the method comprises repeatedly generating a plasma near the substrate. A plasma may thus reach different positions on the substrate. Preferably, positioning the first electrode is carried out at least after generating the plasma near the substrate. This enables generating the plasma a next time on another position near the substrate. By generating the plasma at different positions in this way, the patterning can be achieved. However, alternatively or additionally, positioning the first electrode may be carried out during generating the plasma. This enables formation of a track along the surface of the substrate that is treated by the plasma. This can be reached e.g. by moving the plasma along the surface of the substrate. In this way the patterning can be achieved.

In an embodiment, the intermediate structure is formed as, e.g. has the shape of or is manufactured as, a sheet provided with at least one aperture, preferably a plurality of apertures.

In another embodiment, the intermediate structure is formed as, e.g. has the shape of or is manufactured as, a sheet that comprises a process material, such as a precursor or depositable material, the method comprising displacing at least part of the process material by means of the plasma, for processing the at least part of the process material, e.g. depositing at least part of the depositable material on the substrate.

Both embodiments may be advantageously combined. Thus, the intermediate structure may comprise the sheet provided with the at least one aperture, preferably the plurality of apertures, and may further comprise the sheet that comprises the process material.

In an embodiment, the method comprises selectively generating the plasma discharge by positioning the first electrode with respect to the second electrode in a first position in which a distance between the first discharge portion and the second discharge portion is sufficiently small to support the plasma discharge at the high voltage difference, and selectively extinguishing the plasma discharge by positioning the first electrode with respect to the second electrode in a second position in which the distance between the first discharge portion and the second discharge portion is sufficiently large to prevent plasma discharge at the high voltage difference.

The method preferably further comprises selectively etching the surface by means of the plasma discharge, selectively depositing a material onto the surface by means of the plasma discharge, and/or selectively changing a property of the surface, e.g. changing it from hydrophobic to hydrophilic, by means of the plasma discharge.

The device according to the invention may be used for treating the surface of an electrically insulating substrate, such as a plastic object, e.g. a sheet of plastic. The device according to the invention may also be used for treating the surface of a semiconducting or conducting substrates. When using the (semi-)conducting substrate, the first and/or second electrodes are preferably covered, e.g. coated, with electrically insulating material as described above. It will be appreciated that the electrically conducting substrate may also be used as the second electrode.

It has been found that the device according to the invention is suitable for use in treating the surface of various substrates. The invention also relates to a method for manufacturing a meso-scale electronics device (such as an (O)LED device, an RFID tag, or a solar-cell device), a meso-scale three dimensional structure (such as a MEMS device, a micro-lens or a multi-focus lens), a lab-on-chip, a biochip, a printable plastics object or an offset printing plate from a substrate, comprising treating the substrate with a device for generating a plasma discharge according to the invention. E.g., the process material may be a metallic material arranged for manufacturing electrically conducting tracks on the substrate. E.g., the process material may contain fluorine so that a pattern of hydrophobic area's can be formed. In this way, reliability and resolution of inkjet printed patterns may be improved.

The invention further relates to a method of manufacturing a device for generating a plasma discharge according to the invention, comprising: providing a conventional matrix printer, providing a high voltage source for generating a high voltage difference, electrically conducting connecting at least one printing pen of the print head of the matrix printer with the high voltage source, and optionally electrically conducting connecting the surface of a print drum of the matrix printer with the high voltage source. Hence, the at least one printing pen forms an electrode for generating the plasma.

The invention further relates to a modification kit comprising a high voltage source and a print head for use in a device according to the invention, preferably arranged for carrying out a method according to the invention.

In an embodiment, the modification kit may further comprise a gas inlet for guiding a gas towards a first electrode of the print head. The gas and the high-voltage source may be arranged for generating the plasma in the gas that is guided towards the first electrode of the print head. Optionally, the modification kit comprises transportation means. The transportation means may e.g. be arranged for displacing the print head. The transportation means may e.g. be arranged for displacing the print head and a substrate with respect to each other.

BRIEF DESCRIPTION OF THE DRAWING

The invention will be described by, non-limiting, examples in reference to the accompanying drawing, wherein.

DETAILED DESCRIPTION

Figure 1:
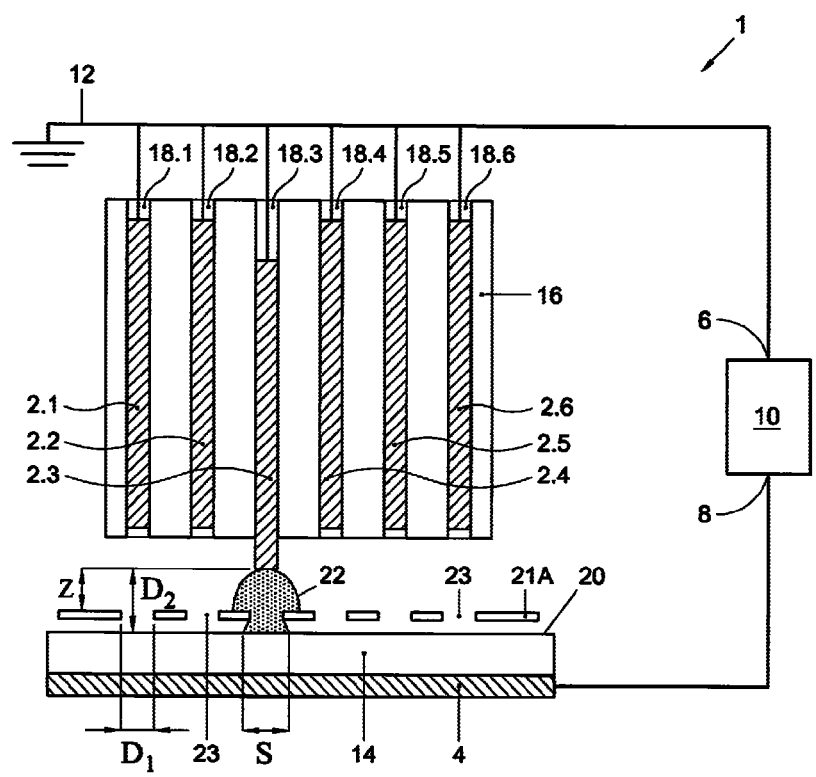
FIG. 1 shows a schematic representation of a first embodiment of a device according to the invention.

FIG. 1 shows a schematic representation of a first embodiment of a device 1 for generating a plasma discharge for patterning the surface of a substrate according to the invention. The plasma is generated near the surface so that it reaches the surface to enable patterning the surface, e.g. by realising a patterned hydrophobicity on the surface.

In this example, the device 1 comprises a plurality of first electrodes $2.i$ (i=1,2,3, . . . ). In this example, the first electrodes $2.i$ are designed as elongate pens. The device 1 further comprises a second electrode 4. In this example, the second electrode is plate-shaped. The first and second electrodes $2.i$, 4 are electrically conducting connected to terminals 6,8 of a high voltage source 10 respectively. The high voltage source 10 is arranged for generating a high voltage difference between the first electrodes $2.i$ and the second electrode 4. In this example, the first electrodes $2.i$ are also connected to ground at 12. It will be appreciated that the first electrodes may be negatively charged with respect to the second electrode or vice versa, e.g. depending on whether ions or electrons are desired to impact onto the substrate. In this example, the high voltage difference comprises a DC voltage difference. Alternatively, or additionally, the high voltage difference may comprise an AC voltage difference (e.g. radiofrequent (RF)), pulsed voltage difference, etc.

In this example a substrate 14 to be treated is positioned in between the first electrodes $2.i$ and the second electrode 4, in this example on top of the second electrode 4. The second electrode 4 of this example is also referred to as counter electrode.

In FIG. 1 the device 1 further comprises a housing 16. The housing 16 comprises a plurality of bores 18.$i$ in each of which one first electrode 2.$i$ is housed. Each first electrode 2.$i$ is slidably housed in its respective bore 18.$i$. In this example, the device 1 comprises positioning means arranged for individually moving each one of the first electrodes 2.$i$ in its respective bore 18.$i$. The positioning means may comprise an electric motor, such as a linear motor, a rack and pinion, a piezoelectric actuator, an electromagnetic solenoid or the like.

Figure 1A:
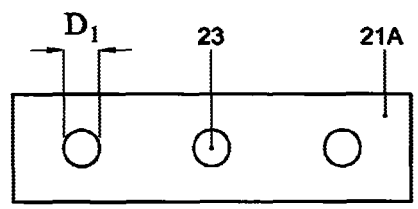
FIG. 1A shows a pinhole plate in a top view.

The device 1 is further provided with an intermediate structure that is, in use, arranged in between the substrate 14 and at least one, in this example all, of the first electrodes 2.$i$. The intermediate structure in this example is formed as a sheet provided with at least one aperture, in this example with a plurality of apertures. The sheet provided with apertures may be provided as a plate 21A provided with apertures 23, also referred to as a pinhole plate 21A. Through the apertures 23, the created plasma 22 can be provided towards the substrate 14. Thus, in use, the plasma can reach the substrate through the apertures 23. While FIG. 1 shows the pinhole plate 21A in a side view, FIG. 1A shows the pinhole plate 21A in a top view.

A maximum dimension for the apertures may be defined. For the approximately circular apertures 23 of this example, the maximum dimension may be a diameter $D_1$. The diameter $D_1$ can optionally be smaller than, e.g. at least two times smaller than, a minimum distance $D_2$ between the first electrode and the substrate. In this way a spot size or track width S of a pattern generated by the plasma can be significantly reduced. However, alternatively, the diameter $D_1$ may, optionally, be larger than or equal to the minimum distance $D_2$ between the first electrode and the substrate. The pinhole plate may essentially consist of an electrically non-conductive material such as ceramic.

The device 1 as discussed thus far may be operated in the following manner.

First the substrate 14 is placed between the second electrode 4 and the first electrodes 2.$i$. The high voltage difference is set and maintained between the first and second electrodes.

When the surface 20 of the substrate 14 is to be selectively treated with a plasma, the location where the surface 20 is to be treated is determined. The first electrode 2.$i$ closest to the determined location on the surface is selected. In this example, first electrode 2.3 is selected.

Initially all first electrodes 2.$i$ may be in a retracted position, as shown for first electrodes 2.1, 2.2, 2.4, 2.5, and 2.6 in FIG. 1. In this retracted position, the distance between the tip (discharge portion) of the first electrode 2.$i$ and the second electrode 4 is sufficiently large to prevent plasma discharge at the high voltage difference. That is, the electric field strength between the first electrode 2.$i$ in the retracted position and the second electrode 4 is sufficiently low to prevent electrical breakthrough.

The positioning means move the selected first electrode 2.3 towards the second electrode 4 into an extended position (see FIG. 1). In this extended position, the distance between the tip (discharge portion) of the selected first electrode 2.3 and the second electrode 4 is sufficiently small to support the plasma discharge at the high voltage difference. That is, the electric field strength between the first electrode in the extended position and the second electrode 4 is sufficiently high to support the onset of a plasma discharge. In FIG. 1 the plasma is indicated at 22.

More in general a separation distance Z between the first electrode 2.$i$, e.g. in extended position, and the intermediate structure may be such that, in use, the first electrodes 2.$i$ do not come into contact with the intermediate structure and/or do not cross a plane of the intermediate structure. In this way, the intermediate structure can be arranged in between the first electrode and the substrate while allowing for positioning the first electrode with respect to the substrate. In some embodiments however, it may be appreciated if the first electrode in the extended position reaches through one of the apertures 23.

Since the electric field between the first and second electrodes passes through the substrate, the device according to FIG. 1 is suitable for sheet-shaped substrates, such as plastics foils.

The fact that the first electrodes can be retracted provides the advantage that there may be less erosion of the first electrodes adjacent to the first electrode that generates the plasma, because the plasma will not reach the retracted first electrodes. This effect will be improved by completely retracting the first electrodes into the housing (as shown in FIG. 1), especially if the housing 16 comprises an electrically insulating bottom near the plasma. This also applies to the first and second electrodes of the devices shown in FIGS. 2 and 3. It will be appreciated, however, that it is not strictly necessary that the electrodes are enclosed by the housing 16. The housing may also comprise a substantially open structure for guiding the electrodes.

By steering the distance between a first electrode and the second electrode, the intensity of the plasma can be steered.

Since the distance between the first electrodes and the surface of the substrate can be controlled, the treatment of curved surfaces and/or 3-dimensional objects may be feasible (possibly in combination with a second electrode that is not flat but follows the shape of the substrate).

Figure 1B:
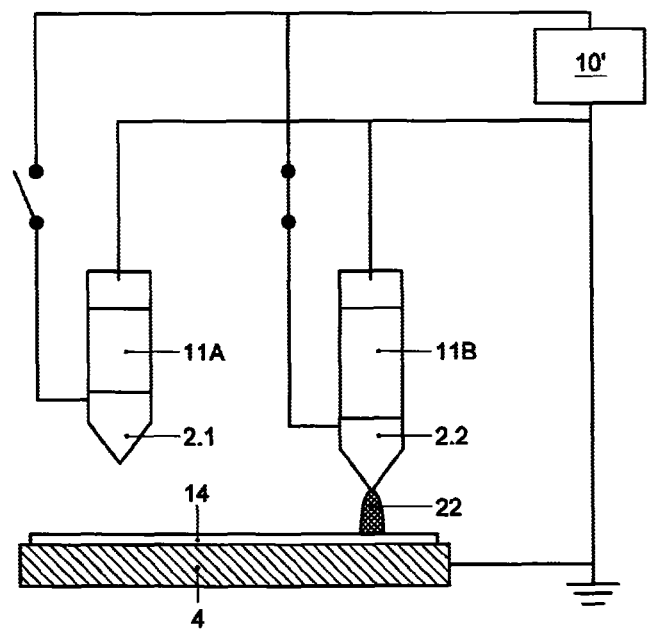
FIG. 1B schematically shows how a piezoelectric actuator can be used.

FIG. 1B schematically shows how the piezoelectric actuator can be used in the device 1, or in a method according to the invention. FIG. 1B shows a first piezoelectric actuator 11A and a second piezoelectric actuator 11B. FIG. 1B shows the second piezoelectric actuator 11B in an extended position. This can be achieved by providing a voltage over the second piezoelectric actuator 11 B by means of a voltage source 10' associated with the piezoelectric actuators. FIG. 1B shows the first piezoelectric actuator 11A in a retracted position. This can be achieved by, at least partly, releasing a voltage over the first piezoelectric actuator 11B by means of the voltage source 10' associated with the piezoelectric actuators. The voltage source 10' associated with the piezo-electric actuators may be formed by the high-voltage source 10 or can be separate from the high-voltage source 10. It will be appreciated that the piezoelectric actuator allows precise extension of the electrode. In the example of FIG. 1B the first electrode 2.1, 2.2 is carried by the piezoelectric actuator 11A, 11B, respectively. It will also be appreciated that it is also possible that the electrode is entirely formed by a piezo-electric actuator, optionally provided with an additional electrically conducting coating on at least a portion of the outer surface thereof at or near the discharge portion.

Figure 2:
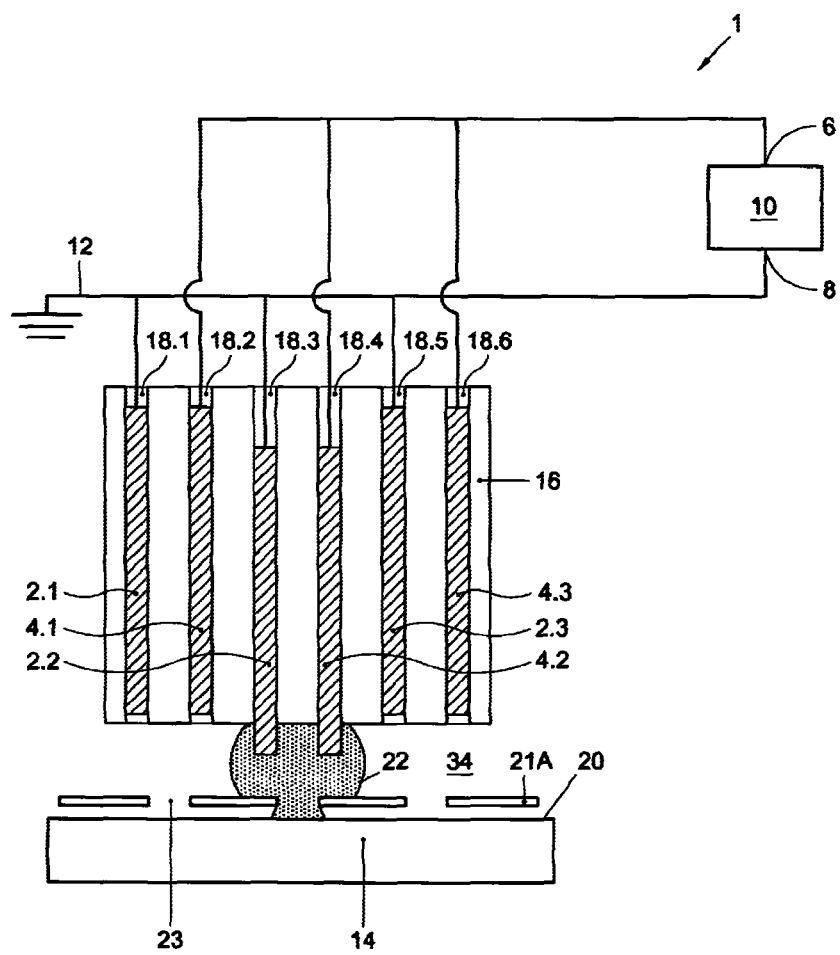
FIG. 2 shows a schematic representation of a second embodiment of a device according to the invention.

FIG. 2 shows a schematic representation of a second embodiment of a device 1 according to the invention. In this example, the plurality of first electrodes 2.$i$ and a plurality of second electrodes 4.$j$ (j=1,2,3, ...) are positioned side-by-side. In this example both the first and second electrodes are slidably housed in their respective bores 18.$k$ (k=1,2,3, ...). FIG. 2 also shows the pinhole plate 21A provided with apertures 23.

The device 1 as shown in FIG. 2 may be operated in the following manner.

The substrate 14 is placed near the first and second electrodes, 2.$i$, 4.$j$. The high voltage difference is set and maintained between the first and second electrodes.

When the surface 20 of the substrate 14 is to be selectively treated with a plasma, the location where the surface 20 is to be treated is determined. The first electrode 2.$i$ and the second electrode 4.$j$ closest to the determined location on the surface are selected. In this example, first electrode 2.2 and second electrode 4.2 are selected.

Initially all first electrodes 2.$i$ and all second electrodes 4.$j$ may be in a retracted position, as shown for electrodes 2.1, 2.3, 4.1, and 4.3 in FIG. 2. In this retracted position, the distance between the tip (discharge portion) of the first electrode 2.$i$ and the tip (discharge portion) of the second electrode 4.$j$ is sufficiently large to prevent plasma discharge at the high voltage difference. That is, the electric field strength between the first electrode 2.$i$ in the retracted position and the second electrode 4.$j$ in the retracted position is sufficiently low to prevent electrical breakthrough.

The positioning means move the selected first electrode 2.2 and the selected second electrode 4.2 towards the extended position (see FIG. 2). In this extended position, the distance between the tip of the selected first electrode 2.2 and the tip of the selected second electrode 4.2 is sufficiently small to support the plasma discharge at the high voltage difference. That is, the electric field strength between the first electrode in the extended position and the second electrode in the extended position is sufficiently low to support the onset of a plasma discharge.

Since in the example of FIG. 2 both the first and the second electrode are positioned at the same side of the substrate 14, also non-sheet-shaped substrates, such as thick substrates, irregularly shaped substrates and/or three-dimensional substrates can be treated with the plasma 22.

As will be described in more detail herein below, the positioning means may be further arranged for positioning the first electrode 2.$i$ along the surface of the substrate. Thus, the housing 16 comprising the electrodes as shown in FIG. 1 and FIG. 2 may be scanned along the surface 20 of the substrate 14. Hence, it is possible to selectively expose areas of the surface 20 to the plasma 22. Herein, the housing 16 comprising the electrodes may be understood to function as a "print head" for plasma treatment instead of ink deposition.

Figure 3:
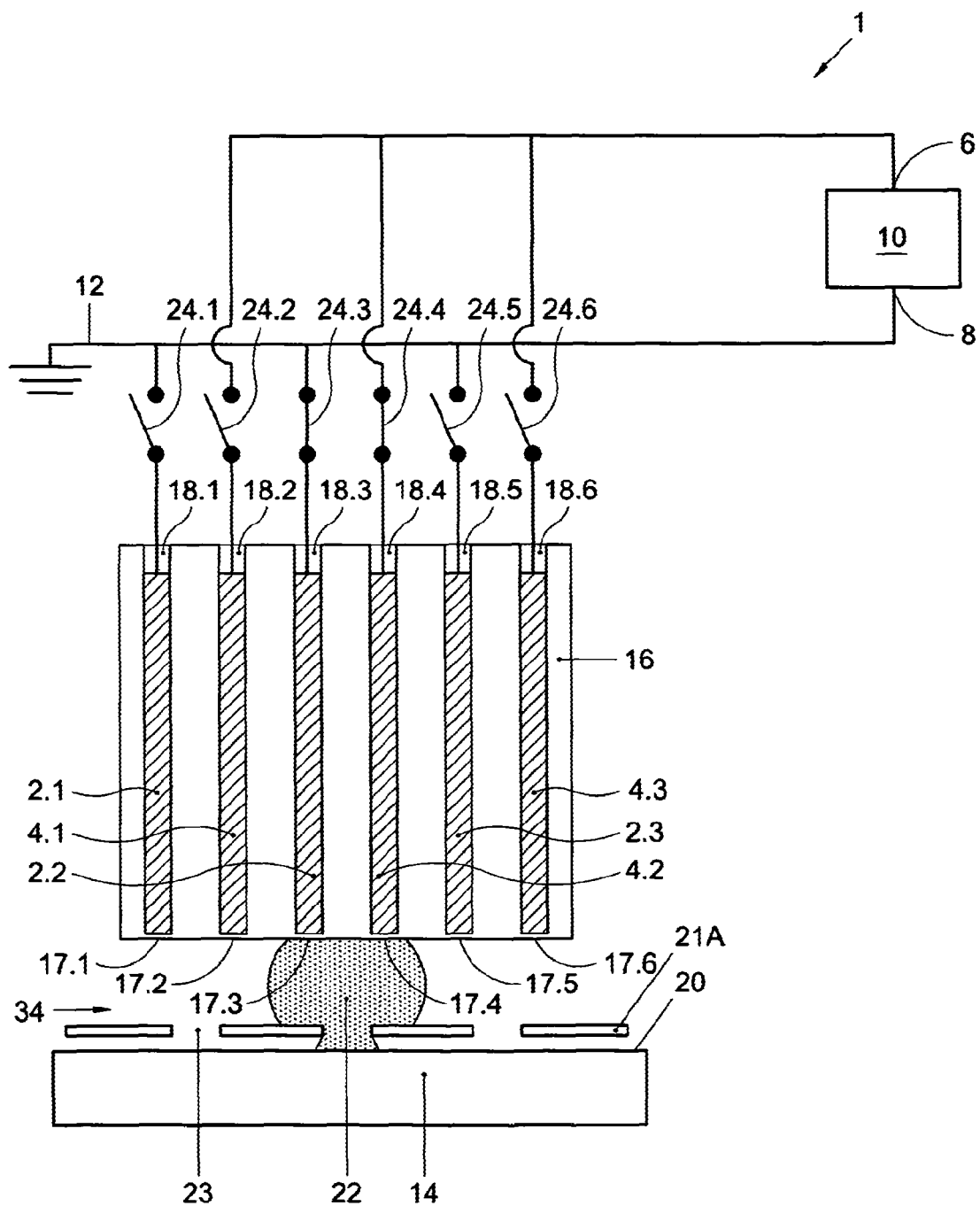
FIG. 3 shows a schematic representation of a third embodiment of a device according to the invention.

FIG. 3 shows a schematic representation of an embodiment of a device 1 according to a second aspect of the invention. The device shown in FIG. 3 is highly similar to the device shown in FIG. 2. One difference is that in the device 1 shown in FIG. 2, the electrodes 2.$i$ and 4.$j$ are connected to the high voltage source 10 via respective switches 24.$k$ ($k$=1,2,3, ... ).

The device 1 as shown in FIG. 3 may be operated in the following manner.

The substrate 14 is placed near the first and second electrodes, 2.$i$, 4.$j$. The high voltage difference is set.

When the surface 20 of the substrate 14 is to be selectively treated with a plasma, the location where the surface 20 is to be treated is determined. The first electrode 2.$i$ and the second electrode 4.$j$ closest to the determined location on the surface are selected. In this example, first electrode 2.2 and second electrode 4.2 are selected.

Initially all first electrodes 2.$i$ and all second electrodes 4.$j$ may be disconnected from the high voltage source 10, so that no plasma discharge is generated. The selected first electrode 2.2 and the selected second electrode 4.2 are connected to the high voltage source 10 via switches 24.3 and 24.4, respectively. The distance between the tip of the selected first electrode 2.2 and the tip of the selected second electrode 4.2 is chosen to be sufficiently small to support the plasma discharge at the high voltage difference. That is, the electric field strength between the first electrode and the second electrode is sufficiently low to support the onset of a plasma discharge.

The switches 24.$k$ may form part of the high voltage source 10. Hence, the high voltage source 10 is arranged to in a first mode selectively generate the high voltage difference at the electrodes 2.$i$ and 4.$j$ to support the plasma discharge, and in a second mode generate a decreased voltage difference or zero voltage difference at the electrodes 2.$i$, 4.$j$ to prevent plasma discharge.

Since in the example of FIG. 3 both the first and the second electrode are positioned at the same side of the substrate 14, also non-sheet-shaped substrates, such as thick substrates, irregularly shaped substrates and/or three-dimensional substrates can be treated with the plasma 22.

In the example of FIG. 3 both the first and second electrodes are selectively connected to the high voltage source. It will be appreciated that also some of the electrodes may be permanently connected to the high voltage source, e.g. all first electrodes 2.$i$ or all second electrodes 4.$j$.

It will be appreciated that the housing 16 the electrodes of the device 101 shown in FIG. 3 may be scanned along the surface 20 of the substrate 14 as described with respect to FIGS. 1 and 2.

In the example of FIG. 3 the housing 16 is provided with electrical insulations 17.$k$ forming a barrier between the electrodes 2.$i$, 4.$j$ and a discharge space 34. The electrical insulations 17.$k$ prevent the electrodes 2.$i$, 4.$j$ to come in direct contact with the plasma 22. Hence, the electrodes are efficiently protected against erosion. The electrical insulations 17.$k$ are designed such that the high voltage difference between the electrodes is sufficient to allow the plasma discharge. It will be appreciated that the electrical insulations 17.$k$ may also be applied in the device 1 as described with respect to FIG. 1, 2, 4$a$, 4$b$ or 5. The electrical insulations may be part of the housing or be a separate covering, e.g. coating, of the electrodes.

For all of the devices shown in FIGS. 1-3, the housing comprising the electrodes may be movable along the substrate 14 like a print head.

Figure 4A:
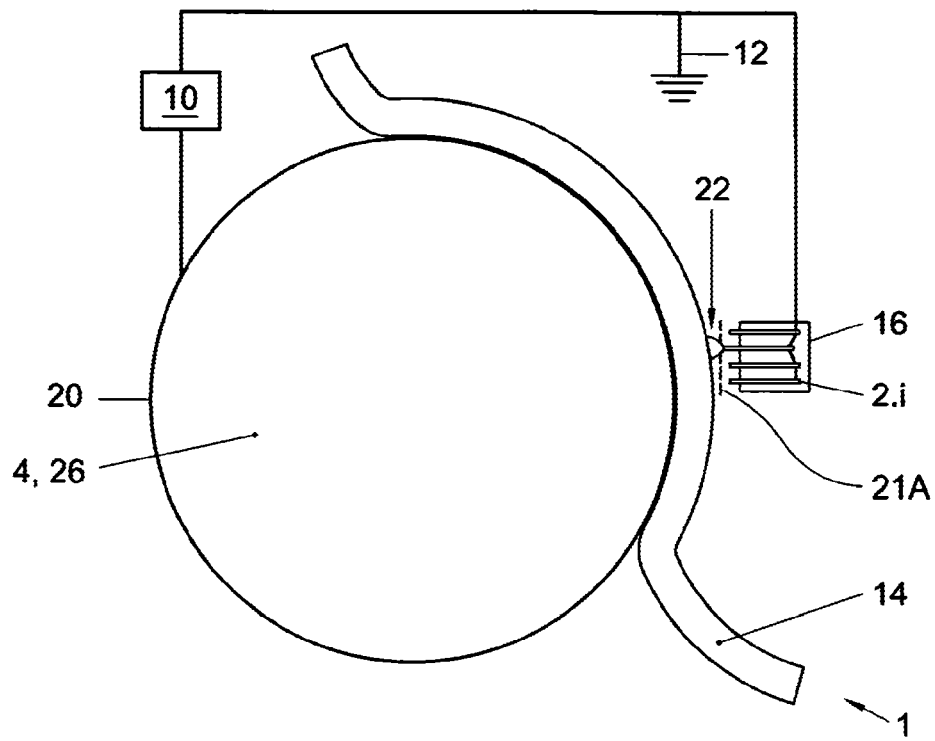
FIGS. 4a and 4b show a schematic representation of a fourth embodiment of a device according to the invention.
Figure 4B:
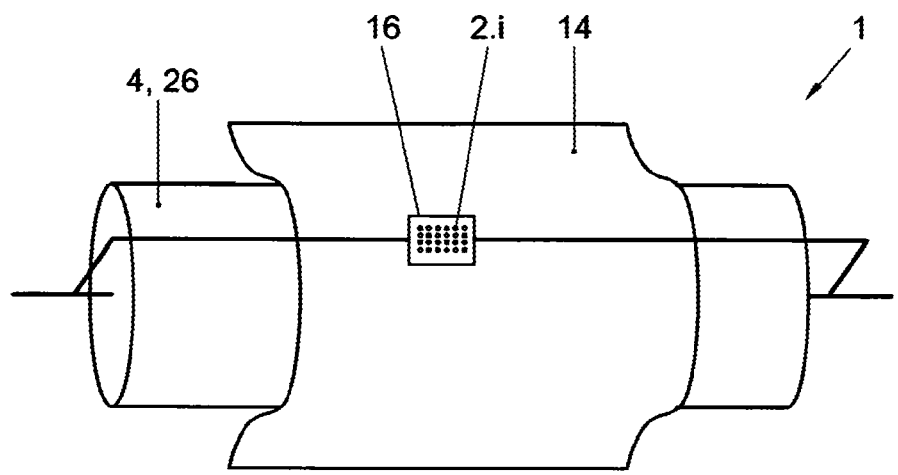

In the example of FIG. 4$a$, the second electrode 4 is designed as a drum 26 on the outer surface 20 of which a sheet-shaped substrate 14 can be placed in between the drum 26 and the first electrodes 2.$i$. In this example, the housing 16 comprising the electrodes is designed as described with respect to FIG. 1. The substrate 14 is transported by the drum shaped second electrode 4, while the housing 16 with the movable first electrodes 2.$i$ can move in the direction perpendicular to the cross-section shown in FIG. 4$a$. FIG. 4$b$ shows a front view of the device 1 according to FIG. 4$a$. Note that in FIG. 4$b$ the housing 16 is shown as comprising a two-dimensional array of first electrodes 2.$i$. It will be appreciated that the housing 16 may also comprise a one-dimensional array of first electrodes 2.$i$ or even a single first electrode 2.

Figure 5:
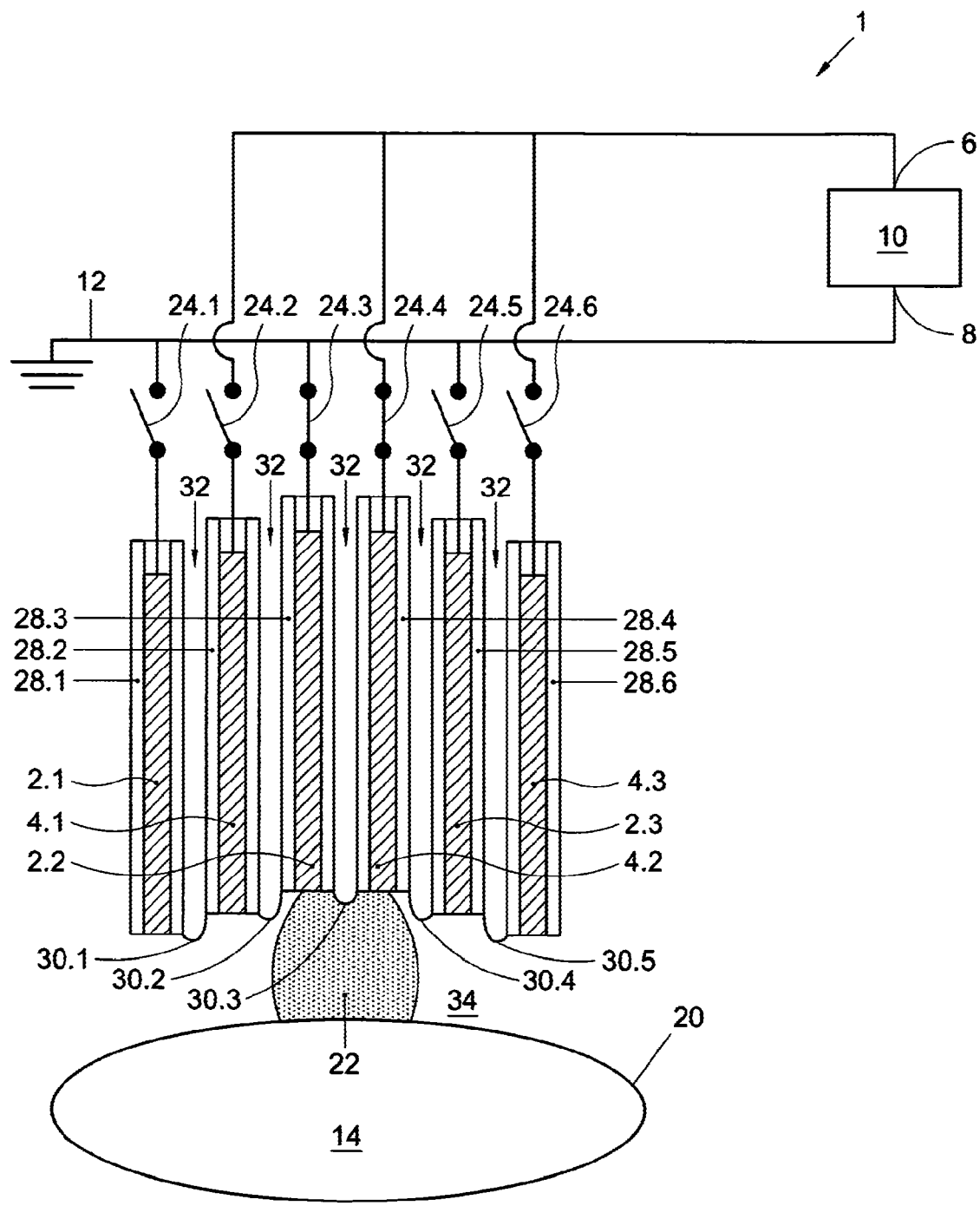
FIG. 5 shows a schematic representation of a fifth embodiment of a device according to the invention.

FIG. 5 shows a further embodiment of a device 1 for generating a plasma discharge, suitable for maskless direct patterning of a substrate 14 according to the invention, i.e. no mask that is provided with the pattern is used. In this example, the device 201 is specially adapted for patterning the surface 20 of a three-dimensional substrate 14. In the example of FIG. 5, the intermediate structure such as the pinhole plate is present although not drawn for clarity.

In this example, the electrodes 2.$i$, 4.$j$ are individually movable in a direction towards and away from the substrate 14, as described with respect to FIGS. 1 and 2. In this example, each electrode 2.*i*, 4.*j* is provided with an electrical insulation 28.*k* mounted fixed with respect to that electrode. Hence, the electrodes 2.*i*, 4.*j* are well protected against erosion.

The device 1 as shown in FIG. 5 may be operated in the following manner.

The substrate 14 is placed near the first and second electrodes, 2.*i*, 4.*j*. All electrodes 2.*i*, 4.*j* are positioned towards the substrate 14 until each electrode touches the surface 20 of the substrate 14. Next all electrodes 2.*i*, 4.*j* are moved away from the surface 20 over a predetermined distance, suitable for generating the plasma 22 for treating the surface 20. Now the electrodes "follow" the contour of the surface 20. Although FIG. 5 shows a one-dimensional array of electrodes, a two-dimensional array of electrodes 2.*i*, 4.*j* is preferred to allow treatment of a surface area of the surface 20 of a three-dimensional substrate.

The high voltage difference is set. When the surface 20 of the substrate 14 is to be selectively treated with a plasma, the location where the surface 20 is to be treated is determined. The first electrode 2.*i* and the second electrode 4.*j* closest to the determined location on the surface are selected. In this example, first electrode 2.2 and second electrode 4.2 are selected.

Initially all first electrodes 2.*i* and all second electrodes 4.*j* may be disconnected from the high voltage source 10, so that no plasma discharge is generated. The selected first electrode 2.2 and the selected second electrode 4.2 are connected to the high voltage source 10 via switches 24.3 and 24.4, respectively.

In the example of FIG. 5, shields 30.*m* (m=1,2,3, . . . ) are mounted in between the electrodes 2.*i*, 4.*j*. In this example, the shields are formed by (electrically insulating) foils. The shields 30.*m* prevent the plasma 22 from entering in an open space 32 between the electrodes 2.*i*, 4.*j*. The shields 30.*m* also allow a gas to be entered into the discharge space 34, while preventing the gas from entering the open space 32 between the electrodes. It will be appreciated that the gas in the discharge space 34 can be chosen to promote plasma discharge. The gas may e.g. comprise Argon or Helium. The gas not being present in the open space 32 may cause the high voltage difference to be unable to cause the plasma discharge in the open space 32. It will be appreciated that these shields 30.*m* are optional, and may, if desired, also be applied in the device according to FIGS. 1, 2, 3, 4*a* and 4*b*.

Figure 5A:
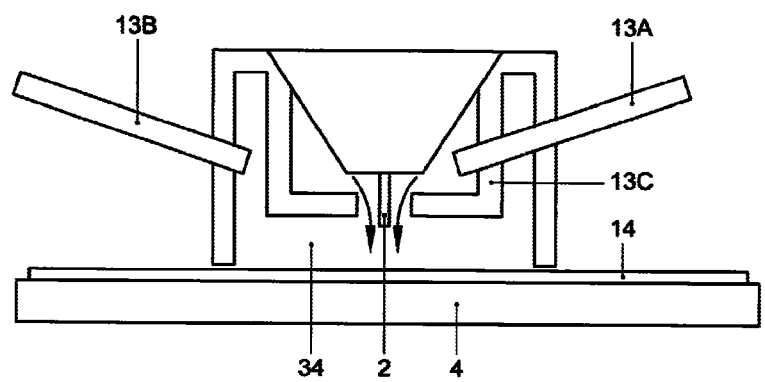
FIG. 5A shows a schematic representation of a further embodiment of a device according to the invention.
Figure 5B:
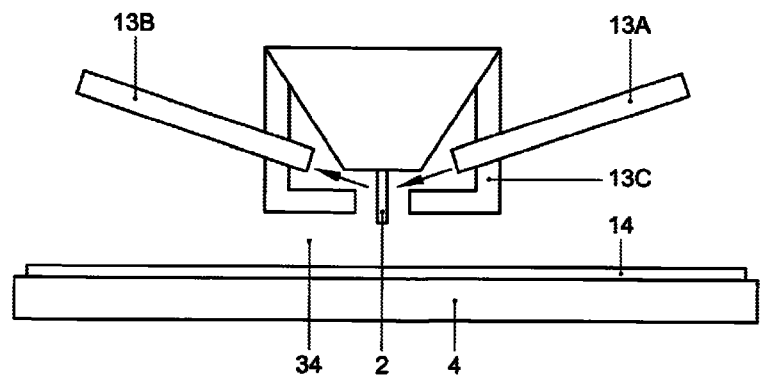
FIG. 5B shows a schematic representation of a further embodiment of a device according to the invention.

FIG. 5A schematically shows how the gas can be entered into the discharge space 34. The device 1 may be provided with a gas supply, e.g. an inlet tube 13A, for supplying the gas, for forming the plasma therein, towards the first electrode 2. The device 1 may further be provided with a gas drain, e.g. an outlet tube 13B, for draining the gas away from the first electrode or the substrate. The device 1 may further be provided with an enclosure 13C that surrounds the first electrode 2. The enclosure 13C may be in fluidum communication with the inlet tube 13A, so that the gas in use flows out of the inlet tube 13A directly into the enclosure 13C. The inlet tube 13A and the outlet tube 13B may be placed in such a way that, before reaching the outlet tube 13B, the gas has to flow out of the enclosure 13C. By means of the inlet tube, the outlet tube, and the enclosure a focussed gas stream may be effectuated. It may be clear however, that a focussed gas stream may also be reached without the enclosure 13C. It is also possible that the outlet tube 13B mouths into the enclosure 13C as shown in FIG. 5B.

The inventors realized that a commercially available matrix printer can easily be converted to a plasma printer comprising a device according to FIG. 1, 1B, 2, 3, 5, 5A, 5B, 6A, 6B, 7, 8, 8B, 9, 10, 11, 12A, 12B, 13, 14 or 15A. The device shown in FIGS. 4*a* and 4*b* could in fact be part of such converted matrix printer.

Converting a conventional matrix printer could be performed as follows. A modification kit in an embodiment according to the invention may be used.

First, a conventional matrix printer is provided, and a high voltage source for generating a high voltage difference is provided. At least one printing pen of the print head of the matrix printer is electrically conducting connected with the high voltage source.

If a device according to FIG. 1 is desired, the outer surface of the print drum of the conventional matrix printer is electrically conducting connected with the high voltage source. If required, the surface of the print drum may be provided with an electrically conducting coating.

If a device according to FIG. 2, 3 or 5 is desired, at least one printing pen of the print head is connected to the positive terminal of the high voltage source, while at least one other printing pen of the print head is connected to the negative terminal of the high voltage source.

When more than two first electrodes 2.*i* and/or second electrodes 4.*j* are used, they can be arranged in a 1- or 2-dimensional array. A smart way to separate the electrodes in such an array from each other is with a membrane as described in patent WO 2008/004858, incorporated herein by reference. In this way, the electrodes 2.*i*, 4.*j* can be placed close together, e.g. in a hexagonal packing, with a membrane separating individual electrodes. When the membrane is electrically insulating, the electrodes are electrically isolated from each other as well. Another advantage of the arrangement and method of pin movement described in WO 2008/004858 is that the electrodes can be moved individually without influencing each other.

Figure 6A:
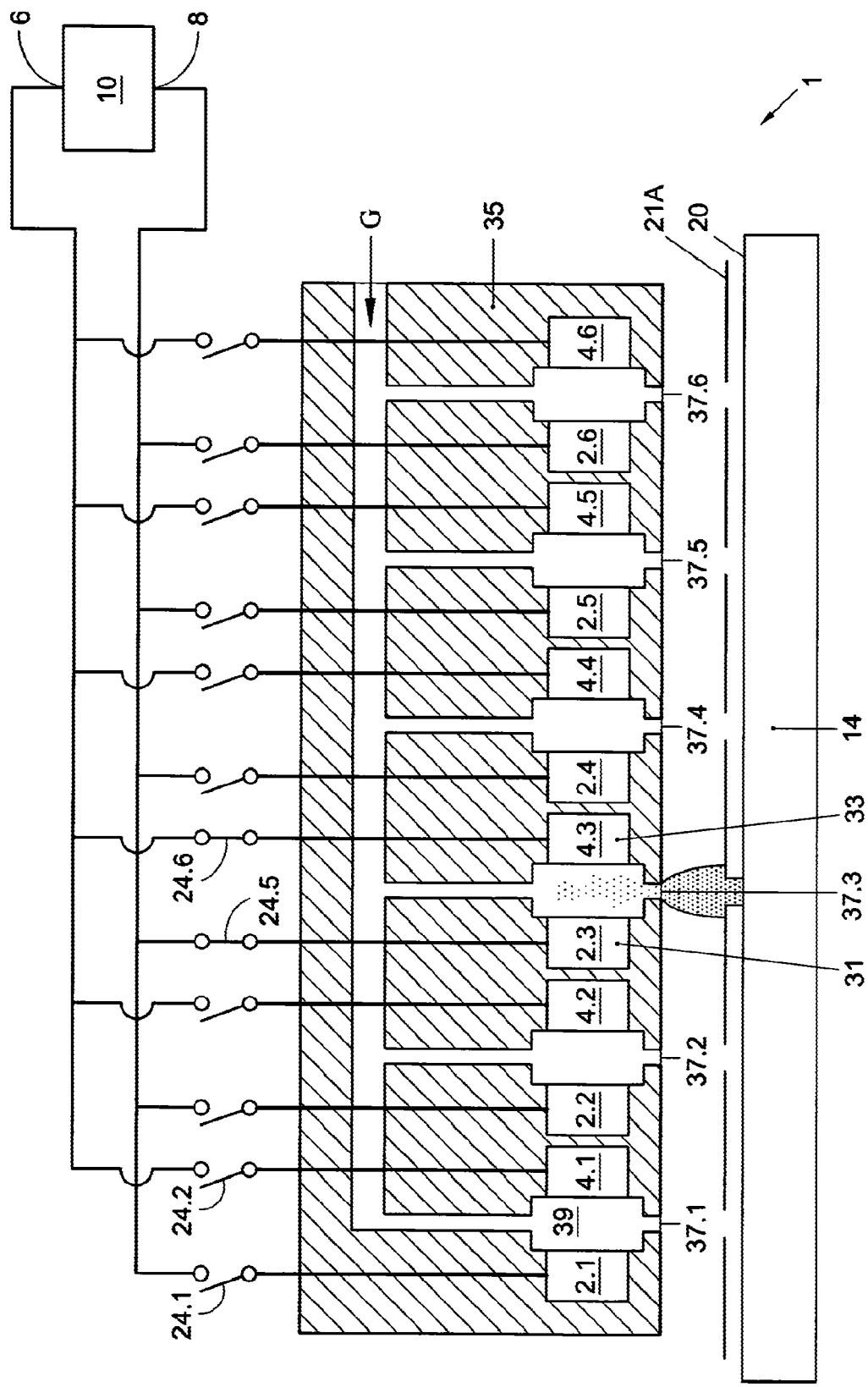
FIG. 6A shows a schematic representation of a sixth embodiment of a device according to the invention.

FIG. 6A shows a sixth embodiment of a device 1 according to the invention. In this embodiment a conventional inkjet print head 35 is converted for the purpose of providing the plasma discharge. In this example, the inkjet print head comprises a plurality of nozzles 37.*n* (n=1,2,3, . . . ). Per nozzle, two piezo-electric elements 31,33 are positioned adjacent an internal ink chamber 39. According to the modification, the piezo-electric elements 31,33 are electrically conducting connected to the terminals 6,8 of the high voltage source 10, respectively. When a high voltage difference is maintained between the piezo-electric elements 31,33, these act as the first and second electrodes 2.*i*, 4.*j*. In the example of FIG. 6A, the intermediate structure is drawn as the pinhole plate 21A.

It will be appreciated that it is also possible in the embodiment of FIG. 6A that the pinhole plate is electrically conductive and functions as the second electrode. In this case only one electrode of the inkjet print head, e.g. one piezo-electric element, in the internal chamber 39 is required for forming the first electrode.

The device of FIG. 6A may be operated as follows. Instead of an ink, a gas flow is fed into the print head 35, as indicated with arrow G. When the surface 20 of the substrate 14 is to be selectively treated with a plasma, the location where the surface 20 is to be treated is determined. The nozzle 37.*n* and the associated first electrode 2.*i* and second electrode 4.*j* closest to the determined location on the surface are selected. In this example, first electrode 2.3 and second electrode 4.3 are selected.

Initially all first electrodes 2.*i* and all second electrodes 4.*j* may be disconnected from the high voltage source 10, so that no plasma discharge is generated. The selected first electrode 2.3 and the selected second electrode 4.3 are connected to the high voltage source 10 via switches 24.5 and 24.6, respectively. Then, in the region between the electrodes, the plasma 22 will be generated. Due to the velocity of the gas flow, the plasma 22 will be ejected from the nozzle 37.3 towards the surface 20 of the substrate. It will be appreciated that the modified inkjet head 35 may be scanned along the surface 20.

Figure 6B:
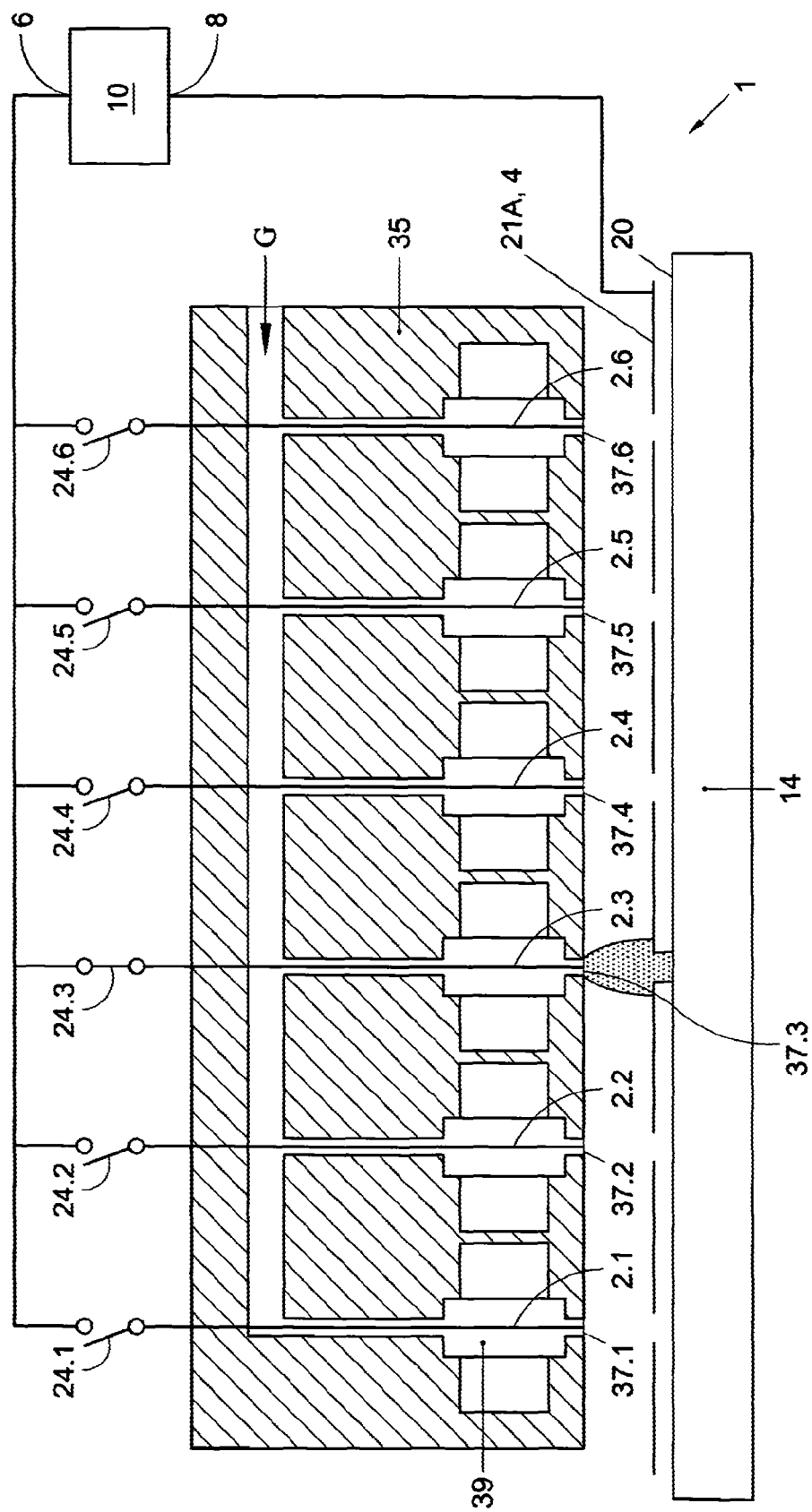
FIG. 6B shows a schematic representation of a variation on the sixth embodiment of a device according to the invention.

FIG. 6B shows a variation on the sixth embodiment of the device 1 according to the invention. In this embodiment a conventional inkjet print head 35 is converted for the purpose of providing the plasma discharge. In this example, the inkjet print head comprises a plurality of nozzles 37.n (n=1,2, 3, . . . ). According to the modification, needle-shaped first electrodes 2.i are mounted to extend through the internal chambers 39 of the head.

The needle-shaped first electrodes may in general e.g. have a diamond tip, e.g. provided with an electrically conductive coating. In this way the first electrodes can be provided with a relatively sharp tip. Hence, a size of the plasma can be reduced. Thus, a spot size or track width during patterning can be reduced.

The first electrodes 2.i are electrically conducting connected to the terminal 6 of the high voltage source 10. The pinhole plate 21A is electrically conducting connected to the terminal 8 of the high voltage source 10 and acts as second electrode 4. In this example, the first electrodes are switched through the switches 24.i. It will be appreciated that the first electrodes 2.i may also be arranged to be moveable form a retracted position to an extended position as indicated e.g. with respect to FIG. 1 or 2.

In the example of FIG. 6B, a gas may be caused to flow through the nozzles 37.n, around the first electrodes 2.i. The gas may e.g. comprise a precursor or depositable material.

It will be appreciated that other conventional inkjet heads may also be converted for forming the device 1 according to the invention. It is for instance possible that the first electrode is formed by a piezo-electric element of the print head while the second electrode is formed by an electrically conducting nozzle plate surrounding the nozzle. It is also possible that an alternative electrically conducting structure within the conventional inkjet print head, such as an electrical heating resistor forms an electrode for generating the plasma.

Figure 7:
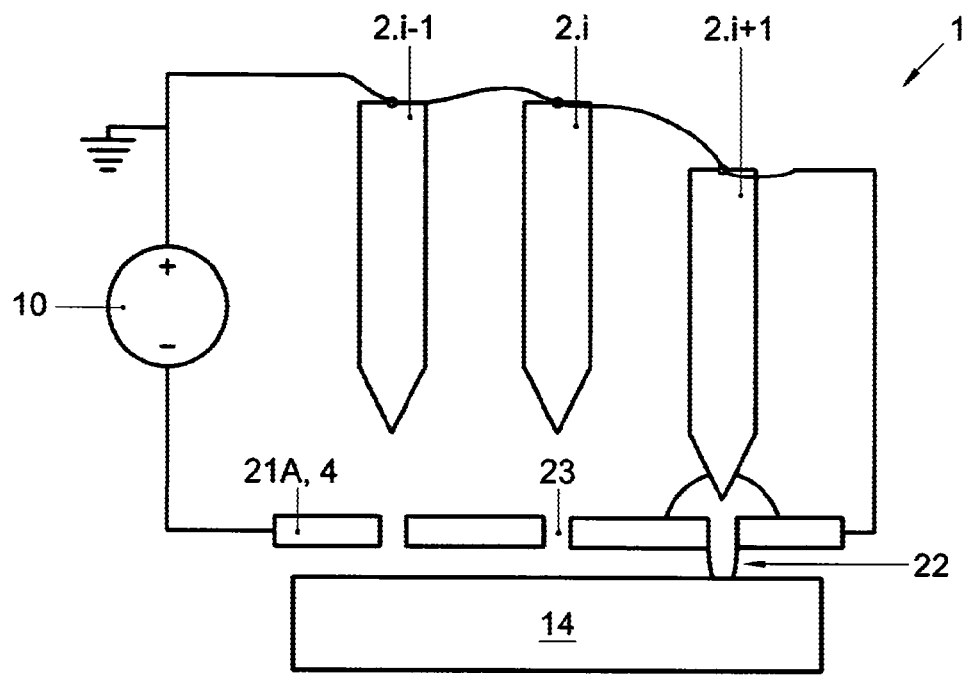
FIG. 7 schematically shows the device 1 in a seventh embodiment according to the invention.

FIG. 7 schematically shows the device 1 in a seventh embodiment according to the invention. FIG. 7 shows the first electrodes 2.i, formed by extendable pens similar to e.g. the first embodiment, the substrate 14, the high-voltage source 10, and the created plasma 22. In the seventh embodiment, the device 1 is further provided with the pinhole plate 21A having the apertures 23. In the seventh embodiment, the examples wherein the pinhole plate essentially consists of an electrically conductive material such as a metallic material, e.g. platinum, silver, and/or gold. The pinhole plate may thus form the second electrode 4.

Figure 8:
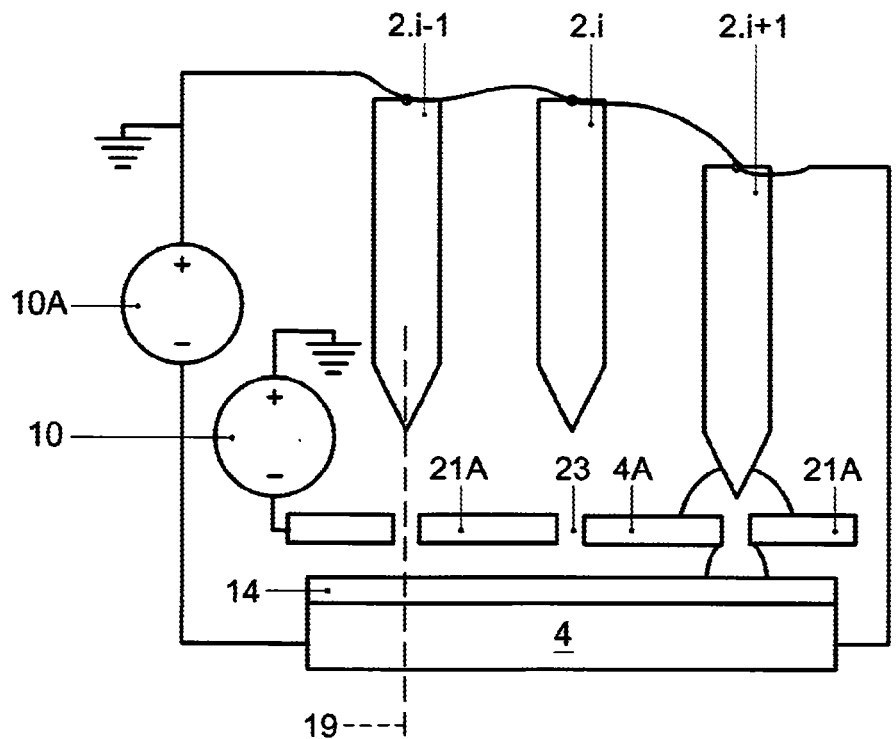
FIG. 8 schematically shows the device 1 in an eighth embodiment according to the invention.

FIG. 8 schematically shows the device 1 in an eighth embodiment according to the invention. In comparison to the seventh embodiment, the device 1 in the eighth embodiment is provided with an additional second electrode 4A and an additional high-voltage source 10A. The additional second electrode 4A and the additional high-voltage source 10A are provided in a similar way as the second electrode 4 and the high-voltage source 10 in FIGS. 1-6. The high-voltage source 10 can be used for controlling a voltage of the second electrode 4. The additional high-voltage source 10A can be used for controlling a voltage of the additional second electrode 4A. Thus, more in general, the device 1 may comprise the first electrode having the first discharge portion, the second electrode having the second discharge portion, and the additional second electrode (a third electrode) having an additional second discharge portion (a third discharge portion). Hence, the device may be provided with three associated electrodes. In use, the three electrodes may be used for controlling the electric field for creating and/or sustaining the plasma. It may be clear that such a three-electrode configuration enables an improved control compared to a configuration with two electrodes. The intermediate structure, such as the pinhole plate, preferably comprising an electrically conducting or semiconducting material, may form the third electrode or the second electrode.

In FIG. 8, the substrate 14 is provided in between the second electrode 4 and the first electrodes 2.i. In FIG. 8, the additional second electrode 4A, i.e. the pinhole plate 21A, is provided in between the substrate 14 and the first electrode. By providing both the second electrode and the additional second electrode, the electric field that enables the generation of the plasma can be better controlled.

In FIG. 8, the first electrodes 2.i are elongatedly shaped along an axis 19 that extends through the at least one aperture 23. Thus, a tip of at least one of the first electrodes 2.i faces one of the apertures 23.

Figure 8B:
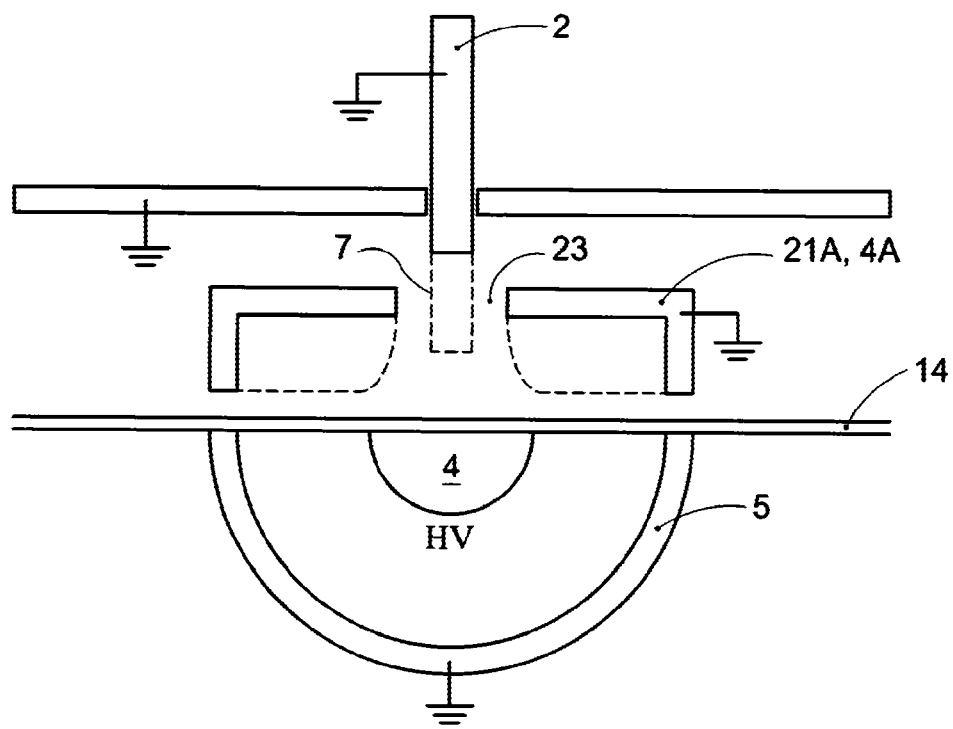
FIG. 8B shows the device in a further embodiment according the invention.

FIG. 8B shows the device 1 in a further embodiment according the invention. In this embodiment, the electrode is provided with the first electrode 2, the pinhole plate 21A that forms the third electrode 4A (also referred to as additional second electrode), and the second electrode 4. The second electrode may have the form of a line, e.g. may have an elongated form. The second electrode may be relatively thin, e.g. may have a maximum cross-sectional width smaller than 100 micrometer or smaller than 30 micrometer. This may enhance the resolution of the device. The second electrode may extend along the substrate 14 at a side of the substrate that faces away from the third electrode and/or the first electrode. The second electrode may be positioned opposite a plurality of first electrodes. The device may further be provided with one or more shielding elements 5. Such shielding elements may, at least partly, surround one or more of the first, second, and third electrodes, e.g. the second electrode as shown in FIG. 8B.

FIG. 8B shows the first electrode 2 in its rest position. FIG. 8B also shows the extended position 7 of the first electrode. In the extended position, the first electrode 2 may at least partly extend in or through the aperture 23. In this way the first electrode can come relatively close the substrate 14. In this example, the first electrode and the third electrode may be grounded. This may be beneficial for electro-magnetic-shielding of the substrate.

Figure 9:
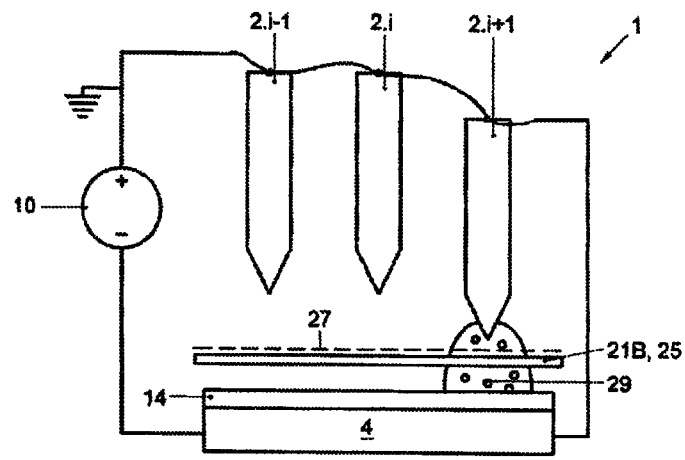
FIG. 9 schematically shows the device 1 in a ninth embodiment according to the invention.

FIG. 9 schematically shows the device 1 in a ninth embodiment according to the invention. In the ninth embodiment, the intermediate structure is formed as a sheet that comprises a process material, in this example a depositable material, 25 that is displaceable by means of the plasma. The sheet may comprise a carrier sheet 27 and may take the form of a ribbon 21B. The carrier sheet 27 may be mesh-shaped. Then, the depositable material 25 may be removable from the carrier sheet 27 by means of the plasma. Without wanting to be bound by any theory, the plasma may cause small droplets, particles or molecules 29 containing part of the depositable material 25 to deposit on the substrate 14. In use, the depositable material 25 may be arranged in between the carrier sheet 27 and the substrate 14. Hence, the carrier sheet 27 may in use face the first electrodes 2.i.

Figure 10:
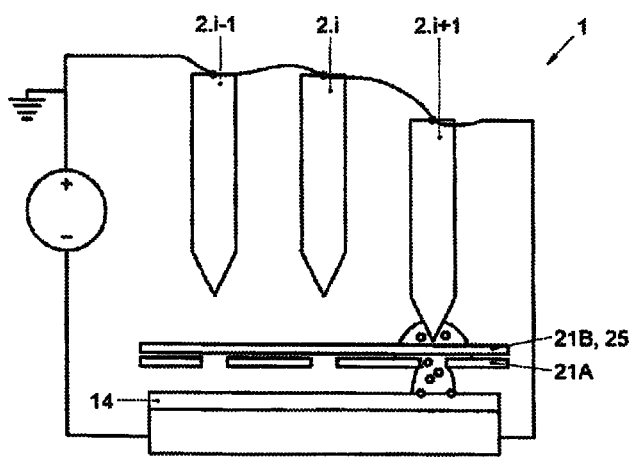
FIG. 10 schematically shows the device 1 in a tenth embodiment according to the invention.
Figure 11:
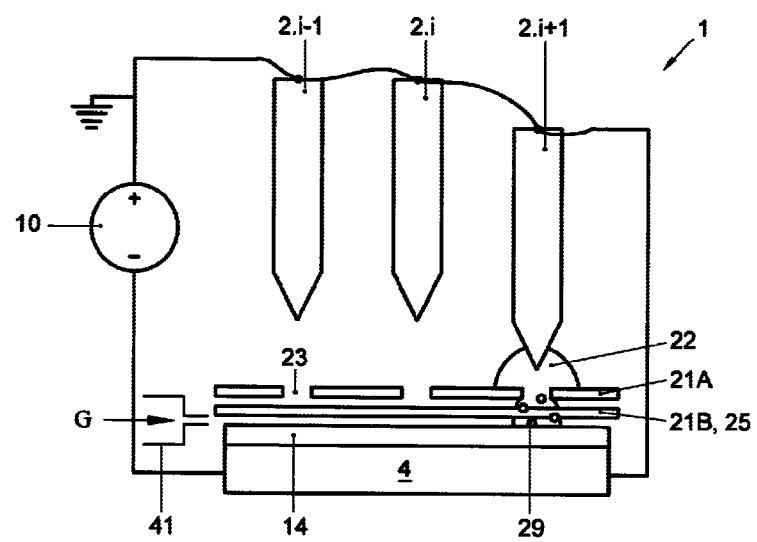
FIG. 11 shows a variation wherein a pinhole plate is arranged in between a sheet that comprises a depositable material and a first electrode.

FIG. 10 schematically shows the device 1 in a tenth embodiment according to the invention. In the tenth embodiment, the device is provided with both the pinhole plate 21A and the ribbon 21B. Similar to influencing the size of the area treated by the plasma, the apertures 23 of pinhole plate 21A can be used to influence a size of an area of the substrate on which part of the depositable material 25 is deposited. In this way, a spot size or track width of a pattern comprising part of the depositable material 25 can be reduced.

In the tenth embodiment, the ribbon 21B may be arranged in between the pinhole plate 21A and the first electrodes 2.*i*. However, in the variation shown in FIG. 11, the pinhole plate is arranged in between the ribbon 21B and the first electrodes 2.*i*. More in general, having the pinhole plate arranged in between the sheet that comprises the depositable material 25, e.g. the ribbon 21B, and the first electrodes 2.*i* enables another advantageous embodiment. Therein, the device 1 comprises a gas inlet 41 that is arranged in the device 1 for providing the gas in between the substrate 14 and the sheet 21 that comprises the depositable material 25.

Further embodiments according the invention may relate to a modification kit comprising a high voltage source and a print head for use in a device according to the invention, e.g. the device 1 in one of the embodiments described herein. The modification kit may further comprise a gas inlet for guiding the gas, e.g. containing Argon, arranged for creating the plasma towards a first electrode of the print head. Such a modification kit may be used for modifying a conventional printer, such as an ink jet printer, or a matrix printer, such as more in particular a hammerbank printer. More in general, the modification kit may be suitable for being mounted to any X-Y writer or positioning device.

Figure 12A:
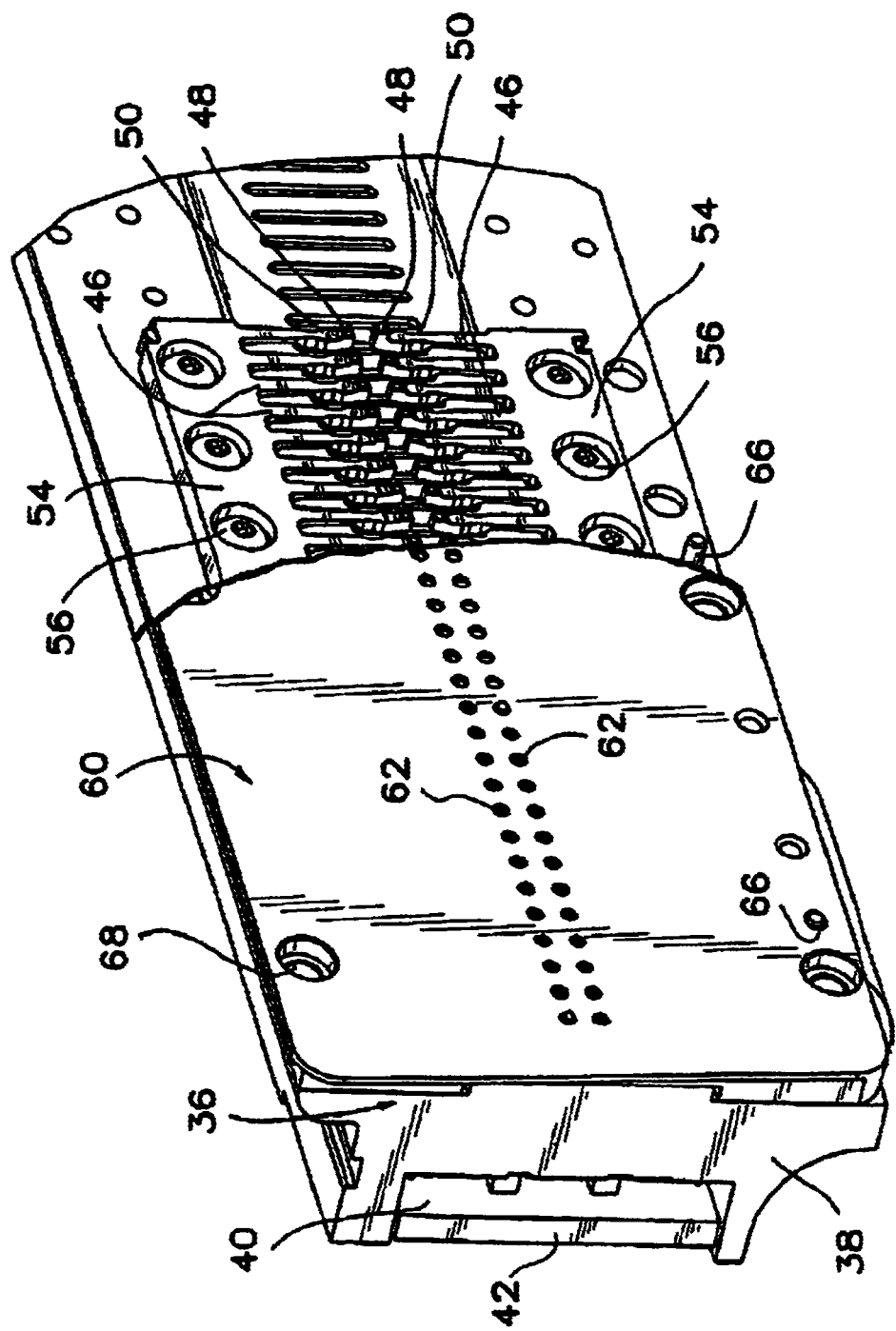
FIGS. 12A and 12B show examples of hammerbanks that may be included in a hammerbank printer.
Figure 12B:
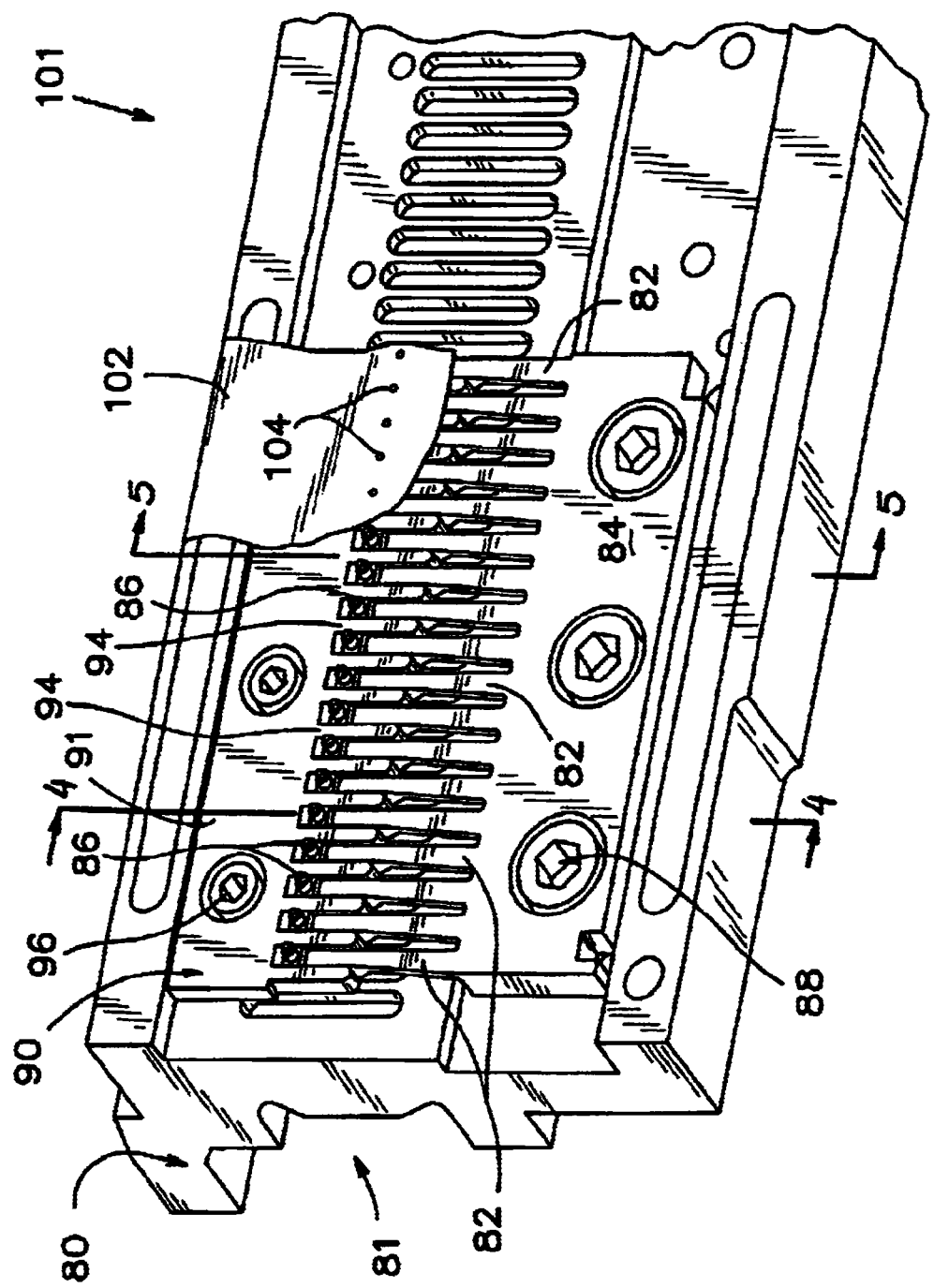

FIGS. 12A and 12B show examples of hammerbanks 101 that may be included in a hammerbank printer. A hammerbank type matrix printer is e.g. known from U.S. Pat. No. 6,779,935 B1, the disclosure of which is incorporated herein by reference. For an explanation of the meaning of reference numbers in FIGS. 12A and 12B that are not made clear in the present application is referred to the corresponding description in U.S. Pat. No. 6,779,935 B1. U.S. Pat. No. 6,779,935 B1 describes how the hammerbank 101 can function in a hammerbank printer.

The hammerbank printer may comprise a plurality of hammers 46, 82 mounted on the hammerbank 36 having printing tips 48, 86, a permanent magnet for retaining said hammers 46, 82, and an electrical drive for releasing said hammers from retention by said permanent magnet. The permanent magnet is not shown in FIGS. 12A and 12B but is shown in FIGS. 4 and 5 of U.S. Pat. No. 6,779,935 B1 with reference number 122. The electric drive system may comprise a printed circuit board. The electric drive system is not shown in FIGS. 12A and 12B but is known as such to the skilled person so that a further description is deemed superfluous. In use, the printing tips may impact a print ribbon for printing on a given media. Embodiments wherein these features, i.e. at least the plurality of hammers, a permanent magnet, and an electrical drive, are incorporated are further described in the detailed specification of a U.S. Pat. No. 6,779,935.

Optionally, the hammerbank printer may comprise two magnetically permeable extensions in longitudinal placement on either side of a first one of the hammers 46, 82 and along the same plane as said hammers for shunting flux from said permanent magnet.

The printing tips 48, 86 may form the first electrodes 2.*i*. The printing tips may be electrically connected to the high voltage source 10 of the modification kit. Part of the electrical connections between the high voltage source and the printing tips 48, 86 may be formed by the hammers 46, 82.

The hammerbank printer may comprise a cover plate 60. Such a cover plate is an example of the intermediate structure 21A and may form the second electrode 4. It will be clear to the skilled person that the modification kit may comprise isolation elements that are designed to isolated the cover plate and the hammers 46, 82 from each other and from other parts of the hammerbank printer. For example, such isolation element may be advantageously mounted under the cover plate 60 near openings 68.

In use, for example all printing tips 48, 86 may be held at the same voltage. When a printing tip is brought towards the second electrode, the electric field strength becomes high enough for generating the plasma. When the printing tip is retracted towards its rest position, the electric field strength decreases again and the plasma disappears. It will be appreciated that it is also possible to not use the cover plate 60 as second electrode, but to position the second electrode underneath the substrate instead.

The hammerbank printer may be a line printer type matrix printer. It may comprise a single row of printing tips, i.e. first electrodes, (FIG. 12B) or a double row of printing tips (FIG. 12A). It may be appreciated that even more than two rows of printing tips may be provided for printing, in one hammerbank. It may also be appreciated that a plurality of hammerbanks, each having one, two or more than two rows of printing tips, may be used in a printing system. Such a system may enable an increased productivity.

During printing by means of one or a plurality of hammerbanks, various way of moving the substrate 14 with respect to a hammerbank may be employed. In general, a particular advantageous method of moving the substrate 14 with respect to the hammerbank may comprise the following steps: a) moving the hammerbank in a first direction and/or moving the substrate in a second direction that is opposite to the first direction, wherein the first and/or the second direction are transverse to a direction in which the row of printing tips extends; b) moving the substrate in a third direction that is transverse to the first and/or the second direction; c) moving the hammerbank and/or the substrate in a direction opposite to the direction of moving the hammerbank and/or the substrate in step a); d) moving the substrate in the third direction. Optionally, steps a)-d) may be repeated, e.g. one time or a plurality of times. In such a way a hammerbank printer can e.g. be used in a roll-to-roll system. The substrate may be continuously fed to the printer. Thus, changing a moving direction of the substrate may be prevented. A single-pass process can thus be obtained.

The inventors realised that, by using a modification kit according to the invention, the hammerbank printer may be advantageously modified. The hammerbank printer or a hammerbank may be provided, and a high voltage source for generating a high voltage difference may be provided. At least one hammer of the hammer bank is electrically conducting connected with the high voltage source.

The modification kit may be used for modifying other printers as well. It may be clear that, accordingly, in a possible method according to the invention, the modification kit may be used for manufacturing a device for generating a plasma discharge according to the first, second, third, fourth, fifth, seventh, eight, ninth, and/or tenth embodiment and/or variations thereon. Such a possible method may comprise: providing a conventional matrix printer; providing a high voltage source for generating a high voltage difference; and electrically conducting connecting at least one printing pen of the print head of the matrix printer with the high voltage source.

In another embodiment of a method according to the invention, the modification kit may be used for manufacturing a device for generating a plasma discharge according to the sixth embodiment or its variety. In this embodiment, the method may comprise: providing a conventional inkjet printer; providing a high voltage source for generating a high voltage difference; and electrically conducting connecting at least one electrical conducting structure of the print head of the inkjet printer with the high voltage source.

It will be recognised that the substrate 14 may be non-flat. The substrate may e.g. be tilted or have a corrugated top with respect to the plasma sources. This may influence the size of the plasma generated, and hence the resolution of the device.

Figure 13:
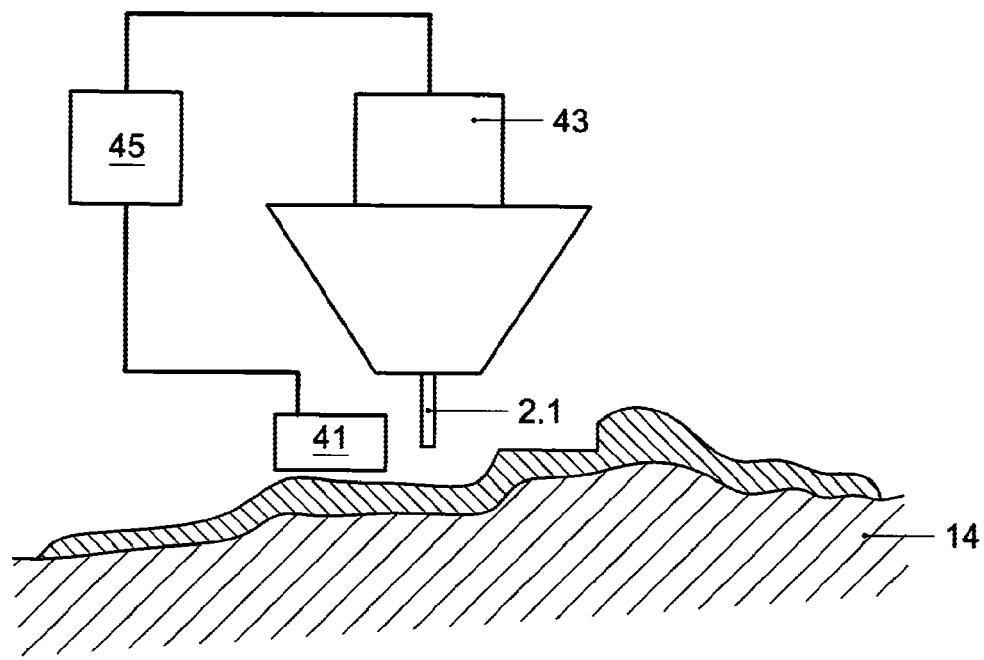
FIG. 13 shows an example of a further embodiment of a device according to the invention.

Thereto, in general and as illustrated by example in FIG. 13, the device 1 may be provided with a height measuring apparatus 41 for determining the height of the plasma source over the substrate. In this example, the device 1 also comprises a height actuator 43 to adjust the height of the plasma source above the substrate 14. In this example, the device 1 also comprises a height controller 45 for controlling, preferably real-time, the height of the plasma source over the substrate to correct for any deformations in the substrate.

Figure 14:
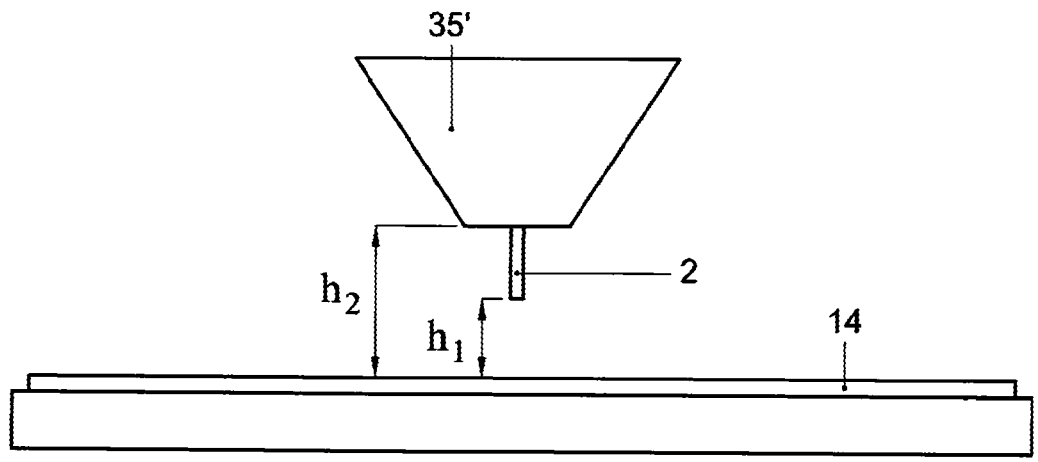
FIG. 14 shows a first height and a second height.

The height of the plasma source over the substrate may e.g. be determined by measuring the electric current through the first electrode when said first electrode generates the plasma. The current is representative of the size of the plasma, and hence of the height of the electrode over the surface of the substrate. Alternatively, the height of the plasma source over the substrate may be determined optically, e.g. using a camera or an autofocus device (such as for instance used in a CD-player). It is also possible to determine the height capacitively or inductively. By means of the height measuring apparatus, a first height $h_1$ between (the tip of) the first electrode 2 and the substrate 14 may be determined and/or a second height $h_2$ between the print head 35' and the substrate 14 may be determined. FIG. 14 shows the first height $h_1$ and the second height $h_2$. The height controller 45 may be arranged for controlling, preferably real-time, the first height $h_1$ and/or the second height $h_2$.

It will be appreciated that the device for generating a plasma discharge, suitable for maskless direct patterning of a substrate as described above may be used for treating the surface of the substrate using the plasma, e.g. for etching the surface, deposition of matter onto the surface, or changing a surface property such as wettability. The latter may e.g. be used for printing purposes, by locally modifying the wettability of the surface with respect to the printing medium (e.g. ink or solder).

It will be appreciated that the device for generating a plasma discharge, suitable for maskless direct patterning of a substrate as described with respect to FIGS. 1-6 above may be used for manufacturing a meso-scale electronics device, such as an (O)LED device, an RFID tag, or a solar-cell device); a meso-scale three dimensional structure, such as a MEMS device, a micro-lens or a multi-focus lens; a lab-on-chip; a biochip; a printable plastics object or an offset printing plate from a substrate.

It will be appreciated that the plasma 22 may be generated under atmospheric conditions. Alternatively, the plasma may be generated at reduced or elevated pressure. The plasma may e.g. be formed in air. The plasma may also be formed in a gas comprising argon, oxygen, ammonia, nitrogen, helium or a mixture thereof Also precursors, e.g. vapourized, may be added to the gas (mixture), e.g. organosilicon compounds, such as hexamethyldisiloxane (HMDSO) or (3-aminopropyl) trimethoxysilane (APTMS), heptylamine, water ($H_2O$), or methanol ($CH_3OH$).

In the foregoing specification, the invention has been described with reference to specific examples of embodiments of the invention. It will, however, be evident that various modifications and changes may be made therein without departing from the broader spirit and scope of the invention as set forth in the appended claims.

In the examples the electrodes in the housing 16 are needle-like. However, other shapes are also possible.

In the example of FIG. 1 the second electrode 4 is plate-shaped. It will be appreciated that other designs are possible. It is for instance possible that second electrode comprises a plurality of needle-like electrodes, each of which may be positioned opposite a needle-like first electrode, with the substrate between the first and second needle-like electrode.

In the example, the needle-like electrodes may be simple metal rods or needles. It will be appreciated that nano-structured or micro-structured electrodes may be used. The nano-/micro-structured electrodes may enhance the field emission, can be used to confine the plasma in a small area hereby increase the resolution of the device, and influence the characteristics and inception voltage of the plasma. These nano-/micro-structured electrodes may e.g. be produced by laser deposition or ablation of a needle tip, dedicated crystal growth at the needle tip or by using carbon nanotubes at the needle tip.

Although FIGS. 1, 1B 2, 3, 5 6A, 6B, 7, 8, 8B, 9, 10, and 11 shows a one-dimensional array of electrodes, a two-dimensional array of electrodes may be used.

It will be appreciated that the electrodes comprising the electrical insulation 28.$k$ as shown in FIG. 5, may also be used in the other embodiments.

In the examples of FIGS. 1-15A, the electrodes in the housing were shown as parallel electrodes, moving in parallel. However, the electrodes do not need to be parallel. The electrodes may for instance be mounted in the housing 16 at an angle with respect to each other. It will be appreciated that when a first and a second electrode are mounted in the housing so as to converge when moved from the retracted to the extended position, the distance between the discharge portion of said electrodes may be reduced highly efficiently. Similar results may be obtained when the electrodes are moved along a curved or angled path in the housing.

In the examples, the discharge portion is located near the tip of the electrode. It is also possible that the discharge portion of the electrode is positioned otherwise, e.g. near a curve of a curved electrode.

In the examples of i.a. FIGS. 3 and 5 the electrodes are selectively connected to the high voltage source through respective switches. It will be appreciated that also alternative switching means are possible, such as electronic switching means, selective amplification etc. It is also possible that the switches switch between a high voltage difference, capable of supporting plasma discharge, and a low voltage difference, capable of extinguishing the plasma discharge. It will be appreciated that it is also possible that the high voltage source is arranged to in a first mode selectively generate the high voltage difference to support the plasma discharge, and in a second mode generate a decreased voltage difference or zero voltage difference to prevent plasma discharge, e.g. by selectively increasing or decreasing a voltage difference between certain electrodes.

Figure 15A:
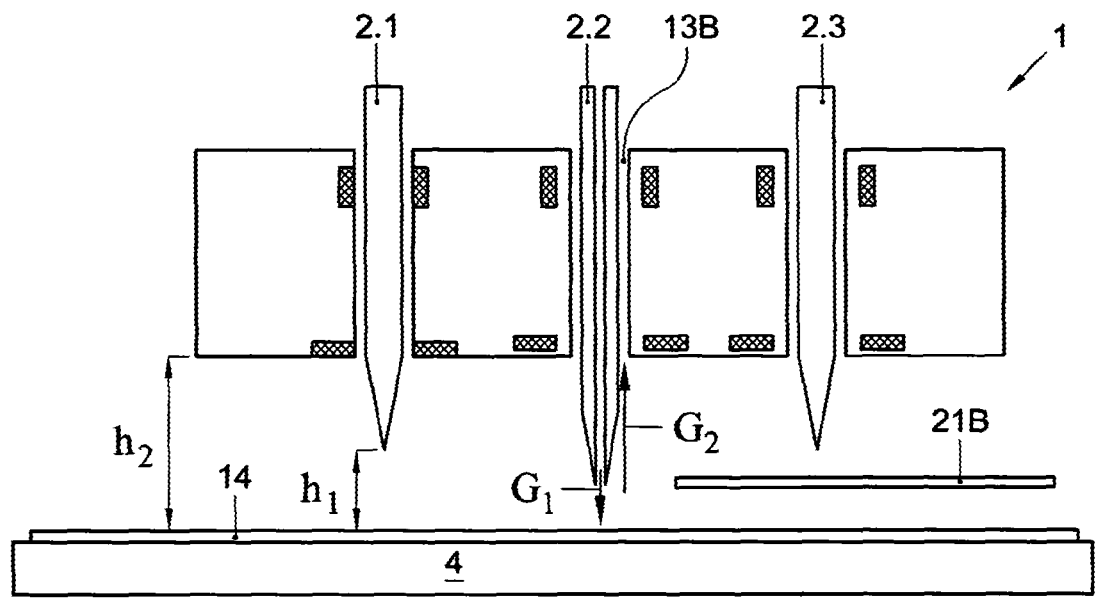
FIG. 15A shows an example wherein a first electrode is formed by a hollow needle.
Figure 15B:
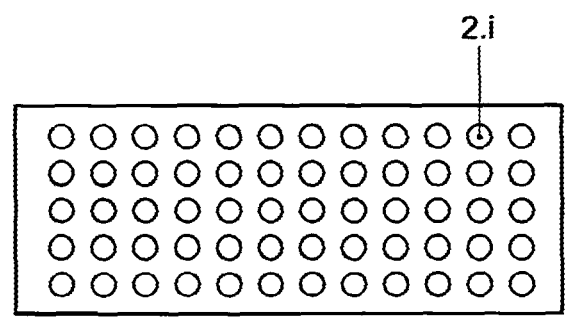
FIG. 15B show a bottom view of a print head of the example of FIG. 15A.

In the examples of FIGS. 1, 1B 2, 3, 4A, 5, 5A, 5B, 6B, 7, 8, 8B, 9, 10, 11, 12A, 12B, 13, 14 and 15A the first electrodes are of elongated shape. It will be appreciated that such electrodes may also be of hollow needle-like shape. Then, a gas may be provided towards the substrate and/or plasma through the hollow electrode. FIG. 15A shows an example wherein the first electrode 2.2 is formed by a hollow needle. Gas flowing out of the hollow needle is indicated by arrow $G_1$. More in general, the device 1 may be provided with a gas drain 13B around the hollow needle 2.2. Flow of drained gas is indicated by arrow $G_2$. By means of the gas flow $G_1$ and/or $G_2$, effective cooling of the first electrode, e.g. the hollow needle, may be achieved. FIG. 15B shows a bottom view of the print head of the example of FIG. 15A, wherein the needles 2.*i* are visible. However, other modifications, variations and alternatives are also possible.

For example, the patterning may be followed by e.g. slot-die coating, dipcoating, or ink jet printing. As a further example, the device 1 in one or more, e.g. all, of the embodiments can e.g. be provided on an platform provided with transportation means for displacing the substrate 14 and/or the first electrodes 2.*i* with respect to each other. Preferably, the transportation means have a relative and/or absolute placement accuracy smaller than or approximately equal to 10 micrometer, more preferably 5 micrometer, in particular 1 micrometer. The transportation means may form the positioning means, although this is not necessary. The transportation means may comprise an x-y table and/or a rotatable element such as a chuck, on which the substrate or the first electrodes 2.*i* can be mounted.

The specifications, drawings and examples are, accordingly, to be regarded in an illustrative rather than in a restrictive sense.

In the claims, any reference signs placed between parentheses shall not be construed as limiting the claim. The word 'comprising' does not exclude the presence of other features or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. Device for generating a plasma discharge near a substrate for patterning a surface of the substrate, comprising
   a plurality of first electrodes having a first discharge portion and a second electrode having a second discharge portion,
   a high voltage source for generating a high voltage difference between the first electrodes and the second electrode, and
   positioning means for positioning the first electrodes with respect to the substrate, wherein the positioning means comprise actuators for selectively positioning the first electrodes with respect to the second electrode in a first position in which a distance between the first discharge portion and the second discharge portion is small enough to support the plasma discharge at the high voltage difference, or in a second position in which the distance between the first discharge portion and the second discharge portion is large enough to prevent plasma discharge at the high voltage difference,
   wherein the positioning means are arranged for individually positioning each first electrode with respect to the second electrode,
   wherein the substrate is electrically conducting and forms the second electrode,
   wherein the device is further provided with an intermediate structure that is, in use, arranged in between the first electrodes and the electrically conducting substrate providing an open space between the intermediate structure and the first electrodes, wherein the intermediate structure comprises an electrically non-conductive material.

2. Device according to claim 1, wherein the intermediate structure consists essentially of an electrically non-conductive material.

3. Device according to claim 1, wherein the positioning means are arranged for moving the first electrodes in a direction towards and away from the second electrode.

4. Device according to claim 1, wherein the positioning means are further arranged for positioning the first electrodes along the surface of the substrate.

5. Device according to claim 1, further comprising a housing, wherein the first electrodes are at least partially surrounded by the housing, and the first electrodes are movable with respect to the housing.

6. Device according to claim 1, wherein the high voltage source is arranged for adjusting the high voltage difference between the first electrodes and the second electrode.

7. Device according to claim 1, comprising a plurality of second electrodes.

8. Device according to claim 1, wherein the positioning means are arranged for individually positioning each first electrode with respect to the remaining first electrodes.

9. Device according to claim 1, wherein the first electrodes are formed by a movable pen of a print head of a matrix printer, electrically conducting connected to the high voltage source.

10. Device according to claim 1, wherein the first electrodes and/or the second electrode is nano-structured or micro-structured, for instance by means of laser deposition or ablation at the discharge portion, dedicated crystal growth at the discharge portion or by providing carbon nanotubes at the discharge portion.

11. Device according to claim 1, comprising a plurality of second electrodes, wherein the high voltage source is arranged for selectively applying the high voltage between at least one first electrode and at least one second electrode.

12. Device according to claim 1, wherein the first electrodes are formed by a printing tip of a hammerbank that is preferably comprised by a hammerbank printer.

13. Method of manufacturing a device for generating a plasma discharge according to claim 1, comprising:
    providing a conventional matrix printer;
    providing a high voltage source for generating a high voltage difference;
    electrically conducting connecting at least one printing pen of the print head of the matrix printer with the high voltage source.

14. Method of manufacturing a device for generating a plasma discharge according to claim 1, comprising:
    providing a conventional inkjet printer;
    providing a high voltage source for generating a high voltage difference;
    electrically conducting connecting at least one electrical conducting structure of the print head of the inkjet printer with the high voltage source.

15. Method of manufacturing a device for generating a plasma discharge according to claim 1, comprising:
    providing a hammerbank printer;
    providing a high voltage source for generating a high voltage difference;
    electrically conducting connecting at least one electrical conducting structure of a hammerbank of the hammerbank printer with the high voltage source.

16. Device according to claim 1, wherein the intermediate structure is formed as a sheet provided with at least one aperture for providing therethrough the plasma.

17. Device according to claim 16, wherein the first electrodes are elongatedly shaped along an axis that extends through the at least one aperture.

18. Device according to claim 1, wherein the intermediate structure is formed as a sheet that comprises a process material that is at least partly displaceable by means of the plasma.

19. Device according to claim 18, wherein the intermediate structure comprises a carrier sheet provided with the process material, wherein the process material is at least partly removable from the carrier sheet by means of the plasma.

20. Device according to claim 19, wherein, in use, the process material is arranged in between the carrier sheet and the substrate.

21. Device according to claim 1, provided with a gas supply for supplying a gas for forming the plasma therein toward the first electrodes, and/or provided with a gas drain for draining a gas away from the first electrodes or the substrate.

22. Device according to claim 21, wherein the first electrodes are provided with the gas-supply arranged for supplying therethrough a gas for forming the plasma.

23. Device according to claim 22, wherein the first electrodes are formed by a hollow pen.

24. Method for patterning the surface of a substrate using a plasma discharge, comprising:
providing a plurality of first electrodes having a first discharge portion and a second electrode having a second discharge portion, wherein the substrate is electrically conducting and forms the second electrode,
generating a high voltage difference between the first electrodes and the second electrode,
selectively generating the plasma near the substrate by positioning the first electrodes with respect to the second electrode in a first position in which a distance between the first discharge portion and the second discharge portion is small enough to support the plasma discharge at the high voltage difference, and
selectively extinguishing the plasma discharge by selectively positioning the first electrodes with respect to the second electrode in a second position in which the distance between the first discharge portion and the second discharge portion is large enough to prevent plasma discharge at the high voltage difference,
individually positioning each first electrode with respect to the second electrode, individually positioning each first electrode with respect to the remaining electrodes, and
arranging an intermediate structure in between the first electrodes and the electrically conducting substrate providing an open space between the intermediate structure and the first electrodes, wherein the intermediate structure comprises an electrically non-conductive material.

25. Method according to claim 24, wherein the intermediate structure consists essentially of an electrically non-conductive material.

26. Method according to claim 24, comprising moving the first electrodes in a direction towards the second electrode when moving the first electrodes into the first position and moving the first electrodes in a direction away from the second electrode when moving the first electrodes into the second position.

27. Method according to claim 24, further comprising scanning the first electrodes along the surface of the substrate.

28. Method according to claim 24, further comprising selectively etching the surface by means of the plasma discharge, selectively depositing a material onto the surface by means of the plasma discharge, and/or selectively changing a property of the surface by means of the plasma discharge.

29. Method according to claim 24, wherein the intermediate structure is formed as a sheet provided with at least one aperture.

30. Method according to claim 29, comprising generating the plasma near the substrate by providing the plasma through the at least one aperture.

31. Method according to claim 24, wherein the intermediate structure is formed as a sheet that comprises a process material, the method comprising displacing at least part of the process material by means of the plasma, for providing the at least part of the process material on or near the substrate.

32. Method according to claim 31, wherein the intermediate structure comprises a carrier sheet provided with the process material, the method comprising removing the at least part of the process material from the carrier sheet by means of the plasma.

33. Method according to claim 31, including arranging the process material in between the carrier sheet and the substrate.

34. Method for manufacturing a meso-scale electronics device, a meso-scale three dimensional structure; a lab-on-chip; a biochip; a printable plastics object or an offset printing plate from a substrate, comprising treating the substrate with a device for generating a plasma discharge according to claim 1.

35. Modification kit comprising a high voltage source and a print head, the print head including
a plurality of first electrodes having a first discharge portion and a second electrode having a second discharge portion, wherein the high voltage source is configured for generating a high voltage difference between the first electrodes and the second electrode,
positioning means for positioning the first electrodes with respect to an electrically conducting substrate, wherein the positioning means comprise actuators for selectively positioning the first electrodes with respect to the second electrode in a first position in which a distance between the first discharge portion and the second discharge portion is small enough to support the plasma discharge at the high voltage difference, or in a second position in which the distance between the first discharge portion and the second discharge portion is large enough to prevent plasma discharge at the high voltage difference, wherein the positioning means are arranged for individually positioning each first electrode with respect to the second electrode,
the kit further including a connector for electrically connecting the electrically conducting substrate to the high voltage source, and
an intermediate structure positionable between the first electrodes and the substrate providing an open space between the intermediate structure and the first electrodes, wherein the intermediate structure comprises an electrically non-conductive material.

36. Modification kit according to claim 35, further comprising a gas inlet for guiding a gas towards the first electrodes of the print head.

* * * * *